(12) United States Patent
Matsumoto et al.

(10) Patent No.: US 12,334,898 B2
(45) Date of Patent: Jun. 17, 2025

(54) HIGH FREQUENCY MODULE AND COMMUNICATION APPARATUS

(71) Applicant: Murata Manufacturing Co., Ltd., Kyoto (JP)

(72) Inventors: Naoya Matsumoto, Kyoto (JP); Takanori Uejima, Kyoto (JP); Yuji Takematsu, Kyoto (JP); Dai Nakagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 279 days.

(21) Appl. No.: 18/067,249

(22) Filed: Dec. 16, 2022

(65) Prior Publication Data

US 2023/0121885 A1  Apr. 20, 2023

Related U.S. Application Data

(63) Continuation of application No. PCT/JP2021/025910, filed on Jul. 9, 2021.

(30) Foreign Application Priority Data

Jul. 9, 2020 (JP) .................. 2020-118615

(51) Int. Cl.
*H03H 9/02* (2006.01)
*H03H 9/00* (2006.01)
(Continued)

(52) U.S. Cl.
CPC ...... *H03H 9/02086* (2013.01); *H03H 9/0014* (2013.01); *H03H 9/0542* (2013.01);
(Continued)

(58) Field of Classification Search
CPC ............ H03H 9/02086; H03H 9/0014; H03H 9/0542; H03H 9/08; H03H 9/1042;
(Continued)

(56) References Cited

U.S. PATENT DOCUMENTS

| | | | |
|---|---|---|---|
| 5,459,368 A * | 10/1995 | Onishi | H03H 9/059 310/313 R |
| 6,873,529 B2 * | 3/2005 | Ikuta | H05K 1/0206 257/E23.101 |

(Continued)

FOREIGN PATENT DOCUMENTS

| | | |
|---|---|---|
| JP | 2006-060747 A | 3/2006 |
| JP | 2006-120981 A | 5/2006 |

(Continued)

OTHER PUBLICATIONS

International Search Report for PCT/JP2021/025910 dated Sep. 21, 2021.

*Primary Examiner* — Andrea Lindgren Baltzell
*Assistant Examiner* — Kimberly E Glenn
(74) *Attorney, Agent, or Firm* — McDonald Hopkins LLC

(57) ABSTRACT

A high frequency module includes a mounting substrate, an acoustic wave filter, a protection member, a resin layer, and a shield layer. The acoustic wave filter is mounted on a first main surface of the mounting substrate. The protection member is disposed on a main surface of the acoustic wave filter that is far from the mounting substrate. The resin layer is disposed on the first main surface of the mounting substrate and covers an outer peripheral surface of the acoustic wave filter and an outer peripheral surface of the protection member. The shield layer covers the resin layer and the protection member. The protection member is in contact with both the acoustic wave filter and the shield layer. The acoustic wave filter includes a piezoelectric substrate. A main surface of the piezoelectric substrate that is far from the mounting substrate is in contact with the protection member.

19 Claims, 21 Drawing Sheets

(51) Int. Cl.
*H03H 9/05* (2006.01)
*H03H 9/08* (2006.01)
*H03H 9/10* (2006.01)
*H03H 9/70* (2006.01)

(52) U.S. Cl.
CPC ............ *H03H 9/08* (2013.01); *H03H 9/1042* (2013.01); *H03H 9/706* (2013.01)

(58) Field of Classification Search
CPC ............... H03H 9/706; H03H 9/02574; H03H 9/02913; H03H 9/0523; H03H 9/059; H03H 9/02102; H03H 9/02834; H03H 9/1014; H03H 9/1064; H01L 23/00; H01L 23/28
See application file for complete search history.

(56) References Cited

U.S. PATENT DOCUMENTS 7,102,461 B2 * 9/2006 Nakano .................. H03H 9/72
                                                    29/25.35

2009/0091904 A1   4/2009   Hatanaka et al.
2017/0250669 A1   8/2017   Kuroyanagi et al.
2017/0273183 A1   9/2017   Kawasaki et al.
2017/0317002 A1  11/2017   Kitahara et al.
2020/0112297 A1   4/2020   Nomiya
2020/0228094 A1   7/2020   Kato
2021/0005579 A1   1/2021   Matsumoto
2021/0297061 A1   9/2021   Taniguchi et al.

FOREIGN PATENT DOCUMENTS

| JP | 2013-198073 A | 9/2013 |
| JP | 2017-157922 A | 9/2017 |
| WO | 2007/114224 A1 | 10/2007 |
| WO | 2016/088681 A1 | 6/2016 |
| WO | 2016/117196 A1 | 7/2016 |
| WO | 2018/198508 A1 | 11/2018 |
| WO | 2018/235522 A1 | 12/2018 |
| WO | 2019/065027 A1 | 4/2019 |
| WO | 2019/181590 A1 | 9/2019 |
| WO | 2020/122005 A1 | 6/2020 |

* cited by examiner

HIGH FREQUENCY MODULE AND COMMUNICATION APPARATUS

CROSS REFERENCE TO RELATED APPLICATION

This is a continuation of International Application No. PCT/JP2021/025910 filed on Jul. 9, 2021 which claims priority from Japanese Patent Application No. 2020-118615 filed on Jul. 9, 2020. The contents of these applications are incorporated herein by reference in their entireties.

BACKGROUND OF THE DISCLOSURE

Field of the Disclosure

The present disclosure relates in general to high frequency modules and communication apparatuses and more particularly to a high frequency module including an acoustic wave filter and a communication apparatus including a high frequency module.

Description of the Related Art

In Patent Document 1, a high frequency module that includes a mounting substrate having a first main surface and a second main surface that face each other, a transmission filter mounted on the first main surface of the mounting substrate, a resin member covering the transmission filter, and a shield electrode layer is disclosed.

In the high frequency module disclosed in Patent Document 1, the shield electrode layer is formed to cover top and side surfaces of the resin member.

Furthermore, in Patent Document 1, a communication apparatus including a high frequency module is disclosed.

Patent Document 1: International Publication No. 2019/181590

BRIEF SUMMARY OF THE DISCLOSURE

There may be a demand for a high frequency module to easily perform printing on a module surface.

A possible benefit of the present disclosure is to provide a high frequency module and a communication apparatus that can easily perform printing on a module surface.

A high frequency module according to an aspect of the present disclosure includes a mounting substrate, an acoustic wave filter, a protection member, a resin layer, and a shield layer. The mounting substrate has a first main surface and a second main surface that face each other. The acoustic wave filter is mounted on the first main surface of the mounting substrate. The protection member is disposed on a main surface of the acoustic wave filter that is far from the mounting substrate. The resin layer is disposed on the first main surface of the mounting substrate and covers an outer peripheral surface of the acoustic wave filter and an outer peripheral surface of the protection member. The shield layer covers the resin layer and the protection member. The protection member is in contact with both the acoustic wave filter and the shield layer. The acoustic wave filter includes a piezoelectric substrate. A main surface of the piezoelectric substrate that is far from the mounting substrate is in contact with the protection member.

A high frequency module according to another aspect of the present disclosure includes a mounting substrate, an acoustic wave filter, a protection member, a resin layer, and a shield layer. The mounting substrate has a first main surface and a second main surface that face each other. The acoustic wave filter is mounted on the first main surface of the mounting substrate. The protection member is disposed on a main surface of the acoustic wave filter that is far from the mounting substrate. The resin layer is disposed on the first main surface of the mounting substrate and covers an outer peripheral surface of the acoustic wave filter and an outer peripheral surface of the protection member. The shield layer covers the resin layer and the protection member. The protection member is in contact with both the acoustic wave filter and the shield layer. The acoustic wave filter includes a supporting substrate that is a silicon substrate. A main surface of the supporting substrate that is far from the mounting substrate is in contact with the protection member.

A communication apparatus according to an aspect of the present disclosure includes the above-mentioned high frequency module and a signal processing circuit. The signal processing circuit is connected to the high frequency module.

A high frequency module and a communication apparatus according to aspects of the present disclosure can easily perform printing on a module surface.

DETAILED DESCRIPTION OF THE DISCLOSURE

Figure 1:
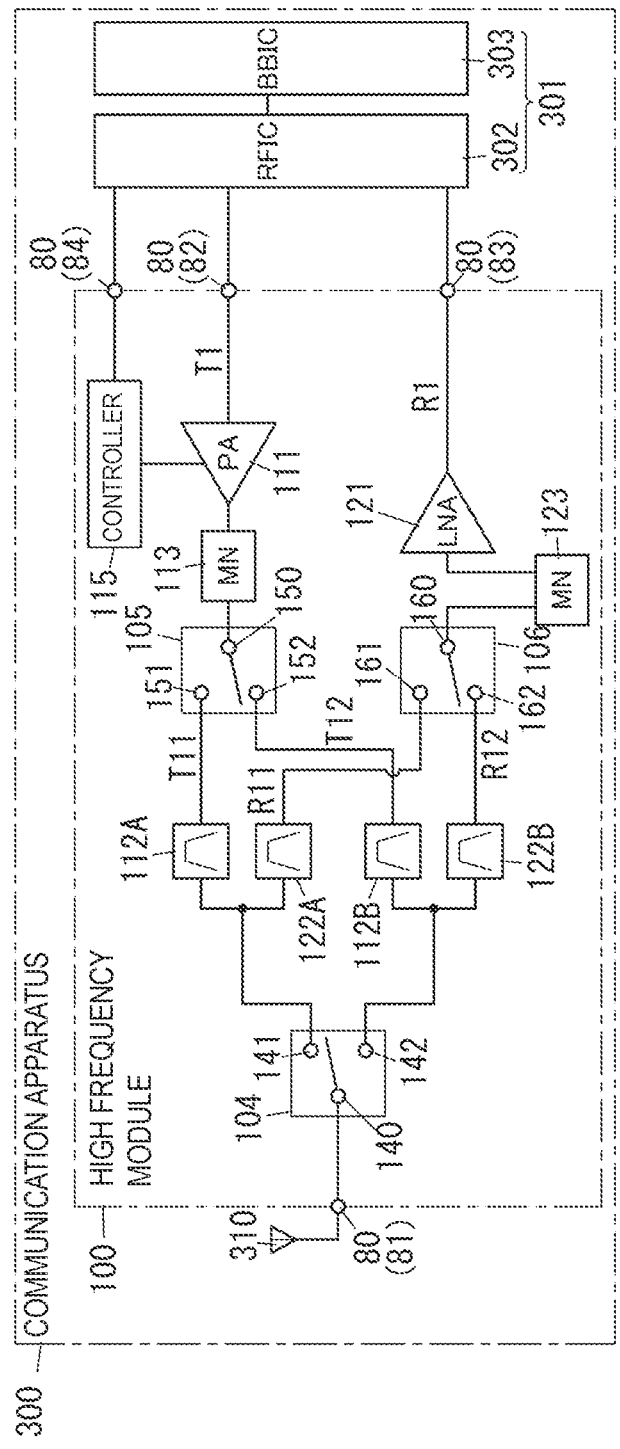
FIG. 1 is a circuit configuration diagram of a communication apparatus including a high frequency module according to a first embodiment.

FIGS. 2 to 22, FIG. 24, and FIG. 25, which will be referenced to in embodiments and the like described below, are schematic diagrams. The size ratio and thickness ratio of the component elements in the drawings do not necessarily reflect the real dimension ratios.

First Embodiment

Figure 2:
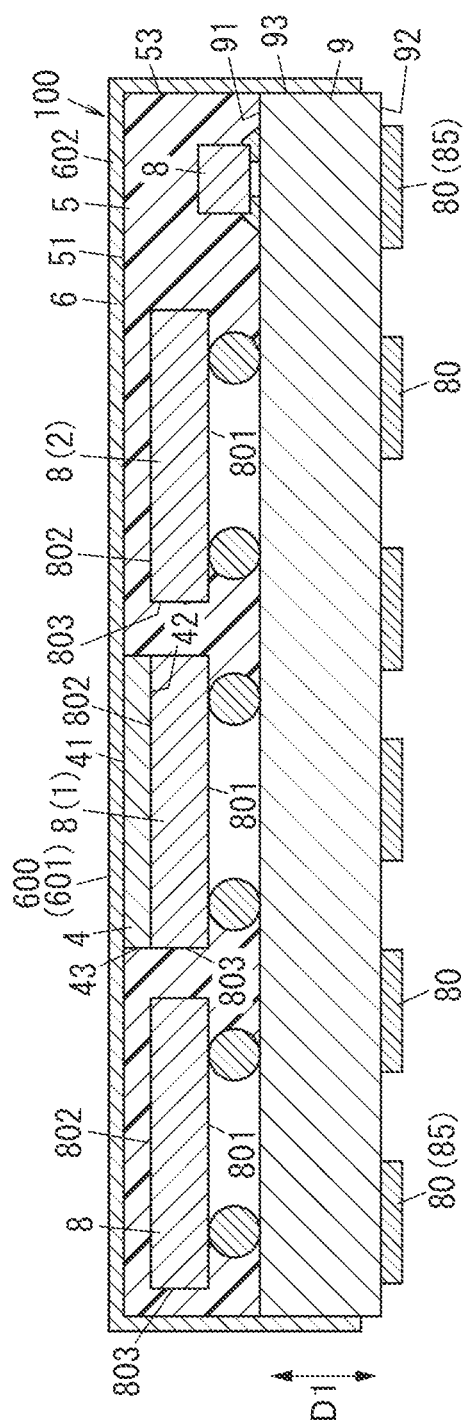
FIG. 2 is a cross-section view of the high frequency module.

A high frequency module 100 according to a first embodiment includes, as illustrated in FIG. 2, a mounting substrate 9, an acoustic wave filter 1, a protection member 4, a resin layer 5, and a shield layer 6. The mounting substrate 9 has a first main surface 91 and a second main surface 92 that face each other. The acoustic wave filter 1 is mounted on the first main surface 91 of the mounting substrate 9. The protection member 4 is mounted on a main surface (second main surface 802) of the acoustic wave filter 1 that is far from the mounting substrate 9. The resin layer 5 is disposed on the first main surface 91 of the mounting substrate 9 and covers an outer peripheral surface 803 of the acoustic wave filter 1 and an outer peripheral surface 43 of the protection member 4. The shield layer 6 covers the resin layer 5 and the protection member 4. Thus, the high frequency module 100 according to the first embodiment can easily perform printing on a module surface (for example, the shield layer 6).

The high frequency module 100 and a communication apparatus 300 according to the first embodiment will be described below with reference to FIGS. 1 to 11.

(1) High Frequency Module and Communication Apparatus (1.1) Circuit Configuration of High Frequency Module and Communication Apparatus A circuit configuration of the high frequency module 100 and the communication apparatus 300 according to the first embodiment will be described with reference to FIG. 1.

The high frequency module 100 according to the first embodiment is used for the communication apparatus 300 that is, for example, capable of supporting multiple modes/multiple bands. The communication apparatus 300 is, for example, a mobile phone (for example, a smartphone). However, the communication apparatus 300 is not necessarily a mobile phone and may be, for example, a wearable terminal (for example, a smartwatch). The high frequency module 100 is a module, for example, capable of supporting 4G (fourth-generation mobile communication) standards and 5G (fifth-generation mobile communication) standards. The 4G standards are, for example, 3GPP (Third Generation Partnership Project) LTE (Long Term Evolution) standards. The 5G standards are, for example, 5G NR (New Radio). The high frequency module 100 is a module capable of supporting carrier aggregation and dual connectivity.

For example, the high frequency module 100 is configured to be capable of amplifying a transmission signal (high frequency signal) inputted from a signal processing circuit 301 and outputting the amplified transmission signal to an antenna 310. Furthermore, the high frequency module 100 is configured to be capable of amplifying a reception signal (high frequency signal) inputted from the antenna 310 and outputting the amplified reception signal to the signal processing circuit 301. The signal processing circuit 301 is not a component element of the high frequency module 100 but is a component element of the communication apparatus 300 including the high frequency module 100. For example, the high frequency module 100 is controlled by the signal processing circuit 301 provided in the communication apparatus 300. The communication apparatus 300 includes the high frequency module 100 and the signal processing circuit 301. The communication apparatus 300 further includes the antenna 310. The communication apparatus 300 further includes a circuit substrate on which the high frequency module 100 is mounted. The circuit substrate is, for example, a printed wiring board. The circuit substrate includes a ground electrode to which a ground potential is applied.

The signal processing circuit 301 includes, for example, an RF signal processing circuit 302 and a baseband signal processing circuit 303. The RF signal processing circuit 302 is, for example, an RFIC (Radio Frequency Integrated Circuit) and performs signal processing for a high frequency signal. For example, the RF signal processing circuit 302 performs signal processing such as up-conversion for a high frequency signal (transmission signal) outputted from the baseband signal processing circuit 303 and outputs the signal-processed high frequency signal. Furthermore, for example, the RF signal processing circuit 302 performs signal processing such as down-conversion for a high frequency signal (reception signal) outputted from the high frequency module 100 and outputs the signal-processed high frequency signal to the baseband signal processing circuit 303. The baseband signal processing circuit 303 is, for example, a BBIC (Baseband Integrated Circuit). The baseband signal processing circuit 303 generates an I-phase signal and a Q-phase signal from a baseband signal. The baseband signal is, for example, an audio signal, an image signal, or the like inputted from the outside. The baseband signal processing circuit 303 mixes an I-phase signal with a Q-phase signal to perform IQ modulation processing and outputs a transmission signal. At this time, the transmission signal is generated as a modulation signal (IQ signal) obtained by amplitude-modulating a carrier signal of a predetermined frequency at a period longer than the period of the carrier signal. For example, a reception signal processed at the baseband signal processing circuit 303 is used as an image signal for image display or an audio signal for conversation. The high frequency module 100 transmits high frequency signals (reception signal and transmission signal) to and from each of the antenna 310 and the RF signal processing circuit 302 of the signal processing circuit 301.

The high frequency module 100 includes a power amplifier 111 and a low noise amplifier 121. The high frequency module 100 also includes a plurality of (in the example in the drawing, two) transmission filters 112A and 112B and a plurality of (in the example in the drawing, two) reception filters 122A and 122B. The high frequency module 100 also includes an output matching circuit 113 and an input matching circuit 123. The high frequency module 100 also includes a first switch 104, a second switch 105, and a third switch 106. The high frequency module 100 also includes a controller 115. In the high frequency module 100 according to the first embodiment, the transmission filter 112A configures the acoustic wave filter 1 described above. In other words, the acoustic wave filter 1 is the transmission filter 112A that is provided on a signal path T1 for transmission signals.

Furthermore, the high frequency module 100 includes a plurality of external connection terminals 80. The plurality of external connection terminals 80 include an antenna terminal 81, a signal input terminal 82, a signal output terminal 83, a control terminal 84, and a plurality of ground terminals 85 (see FIG. 2). The plurality of ground terminals 85 are terminals that are electrically connected to the ground electrode on the circuit substrate described above provided in the communication apparatus 300, and the ground potential is thus applied to the plurality of ground terminals 85.

The power amplifier 111 is provided on the signal path T1 for transmission signals. The power amplifier 111 includes an input terminal and an output terminal. The power amplifier 111 amplifies a transmission signal of a first frequency range inputted to the input terminal and outputs the amplified transmission signal to the output terminal. For example, the first frequency range includes a first communication band and a second communication band. The first communication band corresponds to transmission signals passing through the transmission filter 112A and is, for example, Band 11 of 3GPP LTE standards. The second communication band corresponds to transmission signals passing through the transmission filter 112B and is, for example, Band 22 of 3GPP LTE standards.

The input terminal of the power amplifier 111 is connected to the signal input terminal 82. The input terminal of the power amplifier 111 is connected to the signal processing circuit 301 with the signal input terminal 82 interposed therebetween. The signal input terminal 82 is a terminal for allowing a high frequency signal (transmission signal) from an external circuit (for example, the signal processing circuit 301) to be inputted to the high frequency module 100. The output terminal of the power amplifier 111 is connected to a common terminal 150 of the second switch 105 with the output matching circuit 113 interposed therebetween. The power amplifier 111 is controlled by the controller 115.

The low noise amplifier 121 is provided on a signal path R1 for reception signals. The low noise amplifier 121 includes an input terminal and an output terminal. The low noise amplifier 121 amplifies a reception signal of a second frequency range inputted to the input terminal and outputs the amplified reception signal from the output terminal. For example, the second frequency range is the same as the first frequency range and includes a first communication band and a second communication band.

The input terminal of the low noise amplifier 121 is connected to a common terminal 160 of the third switch 106 with the input matching circuit 123 interposed therebetween. The output terminal of the low noise amplifier 121 is connected to the signal output terminal 83. For example, the output terminal of the low noise amplifier 121 is connected to the signal processing circuit 301 with the signal output terminal 83 interposed therebetween. The signal output terminal 83 is a terminal for allowing a high frequency signal (reception signal) from the low noise amplifier 121 to be outputted to an external circuit (for example, the signal processing circuit 301).

The transmission filter 112A is, for example, a filter that uses a transmission band of the first communication band as a pass band. The transmission filter 112B is, for example, a filter that uses a transmission band of the second communication band as a pass band.

The reception filter 122A is, for example, a filter that uses a reception band of the first communication band as a pass band. The reception filter 122B is, for example, a filter that uses a reception band of the second communication band as a pass band.

The first switch 104 includes a common terminal 140 and a plurality of (in the example in the drawing, two) selection terminals 141 and 142. The common terminal 140 is connected to the antenna terminal 81. The antenna 310 is connected to the antenna terminal 81. The selection terminal 141 is connected to a connection point between the output terminal of the transmission filter 112A and the input terminal of the reception filter 122A. The selection terminal 142 is connected to a connection point between the output terminal of the transmission filter 112B and the input terminal of the reception filter 122B. The first switch 104 is, for example, a switch capable of connecting at least one of the plurality of selection terminals 141 and 142 to the common terminal 140. The first switch 104 is, for example, a switch capable of one-to-one connection and one-to-many connection.

The first switch 104 is provided on both the signal path T1 (T11 and T12) for transmission signals and the signal path R1 (R11 and R12) for reception signals. More specifically, the first switch 104 is provided on the signal path T11 for transmission signals on which the power amplifier 111, the output matching circuit 113, the second switch 105, and the transmission filter 112A are provided. Furthermore, the first switch 104 is provided on the signal path T12 for transmission signals on which the power amplifier 111, the output matching circuit 113, the second switch 105, and the transmission filter 112B are provided. Furthermore, the first switch 104 is provided on the signal path R11 for reception signals on which the reception filter 122A, the third switch 106, the input matching circuit 123, and the low noise amplifier 121 are provided. Furthermore, the first switch 104 is provided on the signal path R12 for reception signals on which the reception filter 122B, the third switch 106, the input matching circuit 123, and the low noise amplifier 121 are provided.

For example, the first switch 104 is controlled by the signal processing circuit 301. The first switch 104 switches the state of the connection between the common terminal 140 and each of the plurality of selection terminals 141 and 142 in accordance with a control signal from the RF signal processing circuit 302 of the signal processing circuit 301. The first switch 104 is, for example, a switch IC (Integrated Circuit).

The second switch 105 includes the common terminal 150 and a plurality of (in the example in the drawing, two) selection terminals 151 and 152. The common terminal 150 is connected to the output terminal of the power amplifier 111 with the output matching circuit 113 interposed therebetween. The selection terminal 151 is connected to the input terminal of the transmission filter 112A. The selection terminal 152 is connected to the input terminal of the transmission filter 112B. For example, the second switch 105 is a switch capable of connecting at least one of the plurality of selection terminals 151 and 152 to the common terminal 150. The second switch 105 is, for example, a switch capable of one-to-one connection and one-to-many connection. The second switch 105 is a switch having a function for switching between the signal paths T11 and T12 for transmission signals of different communication bands.

For example, the second switch 105 is controlled by the signal processing circuit 301. The second switch 105 switches the state of the connection between the common terminal 150 and each of the plurality of selection terminals 151 and 152 in accordance with a control signal from the RF signal processing circuit 302 of the signal processing circuit 301. The second switch 105 is, for example, a switch IC.

The third switch 106 includes the common terminal 160 and a plurality of (in the example in the drawing, two) selection terminals 161 and 162. The common terminal 160 is connected to the input terminal of the low noise amplifier 121 with the input matching circuit 123 interposed therebetween. The selection terminal 161 is connected to the output terminal of the reception filter 122A. The selection terminal 162 is connected to the output terminal of the reception filter 122B. For example, the third switch 106 is a switch capable of connecting at least one of the plurality of selection terminals 161 and 162 to the common terminal 160. The third switch 106 is, for example, a switch capable of one-to-one connection and one-to-many connection. The third switch 106 is a switch having a function for switching between the signal paths R11 and R12 for reception signals of different communication bands.

For example, the third switch 106 is controlled by the signal processing circuit 301. The third switch 106 switches the state of the connection between the common terminal 160 and each of the plurality of selection terminals 161 and 162 in accordance with a control signal from the RF signal processing circuit 302 of the signal processing circuit 301. The third switch 106 is, for example, a switch IC.

The output matching circuit 113 is provided on a signal path between the output terminal of the power amplifier 111 and the common terminal 150 of the second switch 105. The output matching circuit 113 is a circuit for achieving the impedance matching between the power amplifier 111 and the transmission filters 112A and 112B. For example, the output matching circuit 113 is an inductor. However, the output matching circuit 113 is not limited to an inductor and may include, for example, a plurality of inductors and a plurality of capacitors.

The input matching circuit 123 is provided on a signal path between the input terminal of the low noise amplifier 121 and the common terminal 160 of the third switch 106. The input matching circuit 123 is a circuit for achieving the impedance matching between the low noise amplifier 121 and the reception filters 122A and 122B. For example, the input matching circuit 123 is an inductor. However, the input matching circuit 123 is not limited to an inductor and may include, for example, a plurality of inductors and a plurality of capacitors.

The controller 115 is connected to the power amplifier 111. For example, the controller 115 is connected to the signal processing circuit 301 with the control terminal 84 interposed therebetween. The control terminal 84 is a terminal for inputting a control signal from an external circuit (for example, the signal processing circuit 301) to the controller 115. The controller 115 controls the power amplifier 111 in accordance with a control signal acquired from the control terminal 84. The controller 115 controls the power amplifier 111 in accordance with a control signal from the RF signal processing circuit 302 of the signal processing circuit 301.

(1.2) Structure of High Frequency Module

Next, a structure of the high frequency module 100 according to the first embodiment will be described with reference to FIGS. 2 to 4.

The high frequency module 100 according to the first embodiment includes, as illustrated in FIG. 2, the mounting substrate 9, a plurality of electronic components 8, and the plurality of external connection terminals 80. The high frequency module 100 according to the first embodiment further includes the protection member 4, the resin layer 5, and the shield layer 6.

The plurality of electronic components 8 include the power amplifier 111, the low noise amplifier 121, the plurality of transmission filters 112A and 112B, the plurality of reception filters 122A and 122B, the output matching circuit 113, and the input matching circuit 123 described above. The plurality of electronic components 8 also include the first switch 104, the second switch 105, and the third switch 106 described above. That is, the plurality of electronic components 8 include a first electronic component 1 and a second electronic component 2. The first electronic component 1 is, for example, the transmission filter 112A. The second electronic component 2 is, for example, the reception filter 122A.

The mounting substrate 9 has the first main surface 91 and the second main surface 92 that face each other in a thickness direction D1 of the mounting substrate 9. The mounting substrate 9 is, for example, a multilayer substrate including a plurality of dielectric layers and a plurality of conductive layers. The plurality of dielectric layers and the plurality of conductive layers are laminated in the thickness direction D1 of the mounting substrate 9. The plurality of conductive layers are formed in specific patterns set for individual layers. Each of the plurality of conductive layers include one or more conductive parts in a plane orthogonal to the thickness direction D1 of the mounting substrate 9. Each of the conductive layers is made of, for example, copper. The plurality of conductive layers include a ground layer. In the high frequency module 100, the plurality of ground terminals 85 and the ground layer are electrically connected with via conductors or the like, which are provided in the mounting substrate 9, interposed therebetween. The mounting substrate 9 is, for example, an LTCC (Low Temperature Co-fired Ceramics) substrate. The mounting substrate 9 is not necessarily an LTCC substrate and may be, for example, a printed wiring board, an HTCC (High Temperature Co-fired Ceramics) substrate, or a resin multilayer substrate.

Furthermore, the mounting substrate 9 is not necessarily an LTCC substrate and may be, for example, a wiring structure. The wiring structure is, for example, a multilayer structure. The multilayer structure includes at least one insulating layer and at least one conductive layer. The insulating layer is formed in a predetermined pattern. In the case where a plurality of insulating layers are provided, they are formed in predetermined patterns set for individual layers. The conductive layer is formed in a predetermined pattern different from the predetermined pattern of the insulating layer. In the case where a plurality of conductive layers are provided, they are formed in predetermined patterns set for individual layers. The conductive layer may include one or more rewiring parts. In the wiring structure, out of two surfaces that face each other in a thickness direction of the multilayer structure, a first surface is the first main surface 91 of the mounting substrate 9 and a second surface is the second main surface 92 of the mounting substrate 9. The wiring structure may be, for example, an interposer. The interposer may be an interposer including a silicon substrate or a substrate including multiple layers.

The first main surface 91 and the second main surface 92 of the mounting substrate 9 are away from each other in the thickness direction D1 of the mounting substrate 9 and intersect with the thickness direction D1 of the mounting substrate 9. For example, the first main surface 91 of the mounting substrate 9 is orthogonal to the thickness direction D1 of the mounting substrate 9. However, for example, the second main surface 92 may include, as a surface that is not orthogonal to the thickness direction D1, a side face of a conductive part or the like. Furthermore, for example, the second main surface 92 of the mounting substrate 9 is orthogonal to the thickness direction D1 of the mounting substrate 9. However, for example, the second main surface 92 may include, as a surface that is not orthogonal to the thickness direction D1, a side face of a conductive part or the like. Furthermore, fine roughness, recesses, or protrusions may be formed on the first main surface 91 and the second main surface 92 of the mounting substrate 9. The mounting substrate 9 has a rectangular shape when viewed in plan from the thickness direction D1 of the mounting substrate 9. However, the mounting substrate 9 does not necessarily have a rectangular shape and may have a square shape.

In the high frequency module 100 according to the first embodiment, the plurality of electronic components 8 are mounted on the first main surface 91 of the mounting substrate 9. The expression "the plurality of electronic components 8 are mounted on the first main surface 91 of the mounting substrate 9" in the present disclosure includes a state in which the electronic components 8 are disposed on (mechanically connected to) the first main surface 91 of the mounting substrate 9 and a state in which the electronic components 8 are electrically connected to (an appropriate conductive part of) the mounting substrate 9. Thus, in the high frequency module 100, the plurality of electronic components 8 are disposed on the first main surface 91 of the mounting substrate 9. The high frequency module 100 may include a circuit element provided in the mounting substrate 9 as well as the plurality of electronic components 8 mounted on the mounting substrate 9.

Each of the plurality of electronic components 8 has a first main surface 801 and the second main surface 802 that face each other. Each of the plurality of electronic components 8 is disposed on the first main surface 91 of the mounting substrate 9 in such a manner that the first main surface 801 is near the first main surface 91 of the mounting substrate 9 in the thickness direction D1 of the mounting substrate 9. Thus, the second main surface 802 of the electronic component 8 is a main surface that is far from the mounting substrate 9 in the thickness direction D1 of the mounting substrate 9. Furthermore, each of the plurality of electronic components 8 includes the outer peripheral surface 803 that connects the first main surface 801 to the second main surface 802.

The power amplifier 111 is, for example, an IC chip that includes a substrate and a circuit unit (IC unit) including a transistor formed on the substrate. The substrate is, for example, a gallium arsenide substrate. The circuit unit has a function for amplifying a transmission signal inputted to the input terminal of the power amplifier 111. The transistor is, for example, an HBT (Heterojunction Bipolar Transistor).

The power amplifier 111 may include, for example, a DC cut capacitor. The IC chip including the power amplifier 111 is flip-chip mounted on the first main surface 91 of the mounting substrate 9. The outer peripheral shape of the IC chip including the power amplifier 111 when viewed in plan from the thickness direction D1 of the mounting substrate 9 is a quadrangular shape. The substrate of the IC chip including the power amplifier 111 is not necessarily a gallium arsenide substrate and may be a silicon substrate, a silicon germanium substrate, a gallium nitride substrate, or the like. Furthermore, the transistor is not necessarily a bipolar transistor such as an HBT and may be, for example, an FET (Field Effect Transistor). The FET is, for example, a MOSFET (Metal-Oxide-Semiconductor Field Effect Transistor).

The low noise amplifier 121 is, for example, an IC chip that includes a substrate and a circuit unit (IC unit) formed on the substrate. The substrate is, for example, a silicon substrate. The circuit unit has a function for amplifying a reception signal inputted to the input terminal of the low noise amplifier 121. The low noise amplifier 121 is flip-chip mounted on the first main surface 91 of the mounting substrate 9. The outer peripheral shape of the low noise amplifier 121 when viewed in plan from the thickness direction D1 of the mounting substrate 9 is a quadrangular shape.

Each of the plurality of transmission filters 112A and 112B and the plurality of reception filters 122A and 122B is, for example, a ladder filter. Each of the plurality of transmission filters 112A and 112B and the plurality of reception filters 122A and 122B includes a plurality of (for example, four) series-arm resonators and a plurality of (for example, three) parallel-arm resonators. Each of the plurality of transmission filters 112A and 112B and the plurality of reception filters 122A and 122B is, for example, an acoustic wave filter. The acoustic wave filter is configured such that each of the plurality of series-arm resonators and the plurality of parallel-arm resonators is an acoustic wave resonator. The acoustic wave filter is, for example, a surface acoustic wave filter using surface acoustic waves. That is, in the high frequency module 100 according to the first embodiment, the transmission filter 112A, which is configured as the first electronic component 1, is an acoustic wave filter (hereinafter, may also be referred to an "acoustic wave filter 1").

In the surface acoustic wave filter, each of the plurality of series-arm resonators and the plurality of parallel-arm resonators is, for example, a SAW (Surface Acoustic Wave) resonator.

The surface acoustic wave filter includes, for example, a substrate and a circuit unit formed on the substrate. The substrate is a piezoelectric substrate. The piezoelectric substrate is, for example, a lithium niobate substrate. The circuit unit includes a plurality of IDT (Interdigital Transducer) electrodes that are associated with the plurality of series-arm resonators in a one-to-one relationship and a plurality of IDT electrodes that are associated with the plurality of parallel-arm resonators in a one-to-one relationship.

Each of the plurality of transmission filters 112A and 112B and the plurality of reception filters 122A and 122B is, for example, a bare-chip acoustic wave filter. The outer peripheral shape of each of the plurality of transmission filters 112A and 112B and the plurality of reception filters 122A and 122B when viewed in plan from the thickness direction D1 of the mounting substrate 9 is a quadrangular shape. Each of the plurality of transmission filters 112A and 112B and the plurality of reception filters 122A and 122B is flip-chip mounted on the first main surface 91 of the mounting substrate 9.

Each of the first switch 104, the second switch 105, and the third switch 106 is a switch IC. More specifically, each of the first switch 104, the second switch 105, and the third switch 106 is, for example, an IC chip that includes a substrate and a circuit unit (IC unit) including an FET (Field Effect Transistor) formed on the substrate. The substrate is, for example, a silicon substrate. The circuit unit is a functional unit having a function for switching the state of the connection between a common terminal and each of a plurality of selection terminals. The outer peripheral shape of an IC chip configuring each of the first switch 104, the second switch 105, and the third switch 106 when viewed in plan from the thickness direction D1 of the mounting substrate 9 is a quadrangular shape. Each of the first switch 104, the second switch 105, and the third switch 106 is flip-chip mounted on the first main surface 91 of the mounting substrate 9.

An inductor of the output matching circuit 113 is, for example, a chip inductor. The inductor of the output matching circuit 113 is, for example, mounted on the first main surface 91 of the mounting substrate 9. However, the inductor of the output matching circuit 113 is not necessarily mounted on the first main surface 91 of the mounting substrate 9. The outer peripheral shape of the inductor when viewed in plan from the thickness direction D1 of the mounting substrate 9 is a quadrangular shape.

An inductor of the input matching circuit 123 is, for example, a chip inductor. The inductor of the input matching circuit 123 is, for example, mounted on the first main surface 91 of the mounting substrate 9. However, the inductor of the input matching circuit 123 is not necessarily mounted on the first main surface 91 of the mounting substrate 9. The outer peripheral shape of the inductor when viewed in plan from the thickness direction D1 of the mounting substrate 9 is a quadrangular shape.

The plurality of external connection terminals 80 are disposed on the second main surface 92 of the mounting substrate 9. The plurality of external connection terminals 80 are made of, for example, metal (such as copper, copper alloy, etc.).

The plurality of external connection terminals 80 include the plurality of ground terminals 85, in addition to the antenna terminal 81, the signal input terminal 82, the signal output terminal 83, and the control terminal 84 described above. The plurality of ground terminals 85 are electrically connected to the ground layer of the mounting substrate 9, as described above. The ground layer is a circuit ground of the high frequency module 100. The plurality of electronic components 8 include an electronic component 8 electrically connected to the ground layer.

The protection member 4 is disposed on the second main surface 802, which is a main surface of the acoustic wave filter 1 (first electronic component 1) that is far from the mounting substrate 9. In the high frequency module 100 according to the first embodiment, the protection member 4 is disposed between the acoustic wave filter 1 and the shield layer 6 in the thickness direction D1 of the mounting substrate 9. Furthermore, in the high frequency module 100 according to the first embodiment, the protection member 4 is in contact with both the acoustic wave filter 1 and the shield layer 6. The protection member 4 is, for example, a metal block. Materials of the metal block include, for example, copper. In the high frequency module 100 according to the first embodiment, the protection member 4 is only placed on the second main surface 802 of the acoustic wave filter 1. However, since the acoustic wave filter 1 and the protection member 4 are covered by the resin layer 5, the protection member 4 is positioned relative to the acoustic wave filter 1. That is, the protection member 4 is fixed to the acoustic wave filter 1 indirectly by the resin layer 5.

The protection member 4 includes a first main surface 41, a second main surface 42, and an outer peripheral surface 43. The first main surface 41 and the second main surface 42 face each other in the thickness direction D1 of the mounting substrate 9. The outer peripheral surface 43 connects the first main surface 41 to the second main surface 42. In the high frequency module 100 according to the first embodiment, the first main surface 41 of the protection member 4 is in contact with the shield layer 6 and the second main surface 42 of the protection member 4 is in contact with the acoustic wave filter 1. That is, the acoustic wave filter 1 is indirectly in contact with the shield layer 6 with the protection member 4 interposed therebetween. Furthermore, in the high frequency module 100 according to the first embodiment, as described above, the materials of the protection member 4 include copper. Thus, the heat generated at the acoustic wave filter 1 can be transferred to the shield layer 6 through the protection member 4. As a result, the heat dissipation characteristics of the acoustic wave filter 1 can be improved.

The resin layer 5 covers, near the first main surface 91 of the mounting substrate 9, at least part of each of the plurality of electronic components 8 disposed on the first main surface 91 of the mounting substrate 9. The resin layer 5 includes resin. The resin layer 5 may include a filler as well as resin. The resin layer 5 covers the outer peripheral surface 803 of each of the plurality of electronic components 8 and the outer peripheral surface 43 of the protection member 4. Furthermore, the resin layer 5 also covers the second main surface 802 of part of the plurality of electronic components 8. In the high frequency module 100 according to the first embodiment, the first main surface 41, which is the main surface of the protection member 4 that is far from the mounting substrate 9, and a main surface 51 of the resin layer 5 that is far from the mounting substrate 9 are substantially on the same plane.

The shield layer 6 covers the main surface 51 of the resin layer 5 that is far from the mounting substrate 9, an outer peripheral surface 53 of the resin layer 5, and an outer peripheral surface 93 of the mounting substrate 9. In the high frequency module 100 according to the first embodiment, the first main surface 41 of the protection member 4 is exposed, and the shield layer 6 also covers the first main surface 41 of the protection member 4. That is, the shield layer 6 covers the resin layer 5 and the protection member 4. The shield layer 6 is made of, for example, one or more types of metal. The materials of the shield layer 6 include, for example, silver. The shield layer 6 is in contact with the ground layer of the mounting substrate 9. This enables the potential of the shield layer 6 to be equal to the potential of the ground layer.

Figure 3:
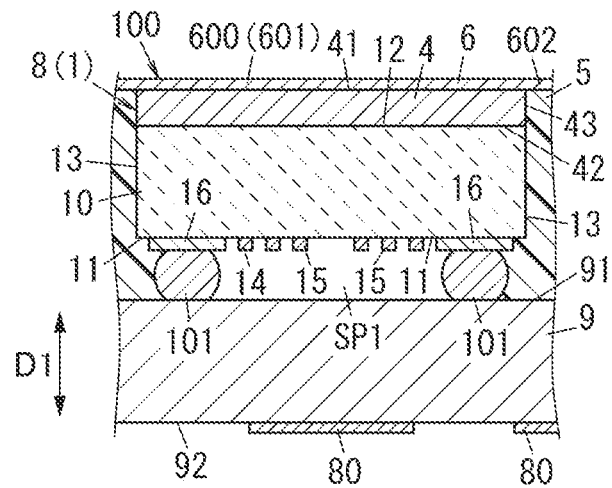
FIG. 3 is a cross-section view of an enlarged part of the high frequency module.

In the high frequency module 100 according to the first embodiment, as illustrated in FIG. 3, the first electronic component 1 includes a first substrate 10, a first circuit unit 14, and a plurality of first pad electrodes 16. The first circuit unit 14 includes a plurality of IDT electrodes 15. The plurality of first pad electrodes 16 are formed near a first main surface 11 of the first substrate 10 and connected to the first circuit unit 14. The high frequency module 100 further includes a plurality of first bumps 101 that are bonded to the plurality of first pad electrodes 16 and the mounting substrate 9. In the high frequency module 100, the plurality of IDT electrodes 15 of a bare-chip acoustic wave filter configuring the first electronic component 1 are disposed in a first space SP1 that is formed, between the first substrate 10 and the mounting substrate 9, by the plurality of first pad electrodes 16, the plurality of first bumps 101, the first substrate 10, the mounting substrate 9, and the resin layer 5. In the high frequency module 100 according to the first embodiment, the first substrate 10 is a piezoelectric substrate, and as illustrated in FIG. 3, a main surface (second main surface 12) of the first substrate 10 that is far from the mounting substrate 9 is in contact with the protection member 4.

Figure 4:
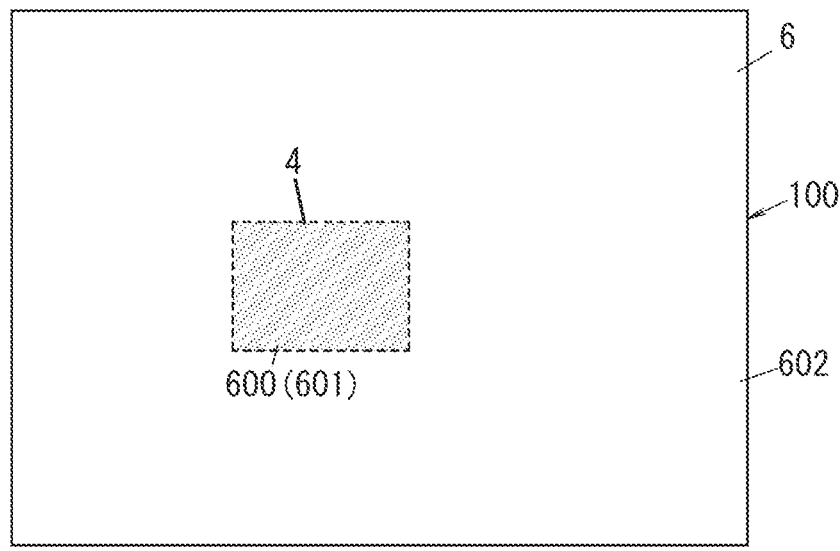
FIG. 4 is a plan view of the high frequency module.

In the high frequency module 100 according to the first embodiment, the shield layer 6 includes, as illustrated in FIG. 4, a first part 601 and a second part 602. The first part 601 is a part of the shield layer 6 that overlaps with the protection member 4 in the thickness direction D1 of the mounting substrate 9. The second part 602 is a part of the shield layer 6 that does not overlap with the protection member 4 in the thickness direction D1 of the mounting substrate 9. In the high frequency module 100 according to the first embodiment, the protection member 4, which is made of metal, is provided between the acoustic wave filter 1 and the shield layer 6 in the thickness direction D1 of the mounting substrate 9. Thus, for example, when printing is performed on the shield layer 6 using a laser marker, the influence on the acoustic wave filter 1 can be reduced by the protection member 4. As a result, the degradation of the acoustic wave filter 1 caused by laser printing can be reduced. FIG. 4 is a plan view of the high frequency module 100. For easier understanding of the distinction between the first part 601 and the second part 602, the first part 601 is hatched with the dots.

(2) Method for Manufacturing High Frequency Module

Next, a method for manufacturing the high frequency module 100 according to the first embodiment will be briefly explained.

A method for manufacturing the high frequency module 100 includes, for example, a first step, a second step, a third step, and a fourth step. The first step is a step for mounting the plurality of electronic components 8 including the first electronic component (acoustic wave filter) 1 on the first main surface 91 of the mounting substrate 9 and disposing the protection member 4 on the second main surface 802 of the first electronic component 1. The second step is a step for forming a resin material layer that is to cover the plurality of electronic components 8 and the protection member 4 and serve as the resin layer 5, near the first main surface 91 of the mounting substrate 9. The third step is a step for grinding the resin material layer from a main surface of the resin material layer that is far from the mounting substrate 9 so that the protection member 4 is exposed. The fourth step is a step for forming the shield layer 6 that is to be in contact with the main surface 51 of the resin layer 5 and the first main surface 41 of the protection member 4 by, for example, sputtering, deposition, printing, or the like.

(3) Summary

(3.1) High Frequency Module

The high frequency module 100 according to the first embodiment includes the mounting substrate 9, the acoustic wave filter 1, the protection member 4, the resin layer 5, and the shield layer 6. The mounting substrate 9 has the first main surface 91 and the second main surface 92 that face each other. The acoustic wave filter 1 is mounted on the first main surface 91 of the mounting substrate 9. The protection member 4 is disposed on a main surface (second main surface 802) of the acoustic wave filter 1 that is far from the mounting substrate 9. The resin layer 5 is disposed on the first main surface 91 of the mounting substrate 9 and covers the outer peripheral surface 803 of the acoustic wave filter 1 and the outer peripheral surface 43 of the protection member 4. The shield layer 6 covers the resin layer 5 and the protection member 4.

In the high frequency module 100 according to the first embodiment, as described above, the protection member 4 is disposed on the main surface of the acoustic wave filter 1 that is far from the mounting substrate 9. In other words, the protection member 4 is disposed between the acoustic wave filter 1 and the shield layer 6 in the thickness direction D1 of the mounting substrate 9. Thus, for example, the influence on the acoustic wave filter 1 in printing on a module surface (shield layer 6) can be reduced by the protection member 4. That is, in the high frequency module 100 according to the first embodiment, the acoustic wave filter 1 can be protected by the protection member 4, and this allows printing on the module surface to be performed easily.

In the case where the acoustic wave filter 1 is not protected by the protection member 4, for example, laser may generate cracks in the first substrate 10 of the acoustic wave filter 1 when printing on the module surface is performed using a laser marker, and the filter characteristics of the acoustic wave filter 1 may be degraded. In contrast, in the high frequency module 100 according to the first embodiment, since the acoustic wave filter 1 is protected by the protection member 4, the degradation in the filter characteristics of the acoustic wave filter 1 can be reduced. As described later, also in a case where the first substrate 10 configuring the acoustic wave filter 1 is a silicon substrate, the degradation in the filter characteristics of the acoustic wave filter 1 can be reduced by the protection member 4 in a similar manner.

Furthermore, in the high frequency module 100 according to the first embodiment, as described above, the materials of the protection member 4 include copper, and the protection member 4 is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved. In the high frequency module 100 according to the first embodiment, in terms of improving the heat dissipation characteristics of the acoustic wave filter 1, it is desirable that the second main surface 802 of the acoustic wave filter 1 and the second main surface 42 of the protection member 4 be in contact with each other entirely and the shield layer 6 be in contact with the entire first main surface 41 of the protection member 4. However, the second main surface 802 of the acoustic wave filter 1 and the second main surface 42 of the protection member 4 are not necessarily in contact with each other entirely and the shield layer 6 is not necessarily in contact with the entire first main surface 41 of the protection member 4.

Furthermore, in the high frequency module 100 according to the first embodiment, the heat generated at the acoustic wave filter 1 can be dissipated through the protection member 4 and the shield layer 6. Thus, an increase of the temperature of a lithium niobate substrate configuring the first substrate 10 can be reduced. As a result, in the high frequency module 100 according to the first embodiment, the stable temperature characteristics of the acoustic wave filter 1 can be achieved, and the stable characteristics of the high frequency module 100 can be achieved.

Furthermore, in the high frequency module 100 according to the first embodiment, unwanted waves (for example, unwanted bulk waves) propagating in a direction along the thickness direction of the lithium niobate substrate configuring the first substrate 10 can be made to scatter at the interface between the first substrate 10 and the protection member 4, and the filter characteristics of the acoustic wave filter 1 can thus be improved. The improvements of the filter characteristics include, for example, the reduction of the harmonic wave distortion and the like.

(3.2) Communication Apparatus

The communication apparatus 300 according to the first embodiment includes the high frequency module 100 described above and the signal processing circuit 301. The signal processing circuit 301 is connected to the high frequency module 100.

The communication apparatus 300 according to the first embodiment includes the high frequency module 100. Thus, printing on the module surface can be easily performed.

For example, a plurality of electronic components configuring the signal processing circuit 301 may be mounted on the circuit substrate described above or may be mounted on another circuit substrate (second circuit substrate) different from the circuit substrate (first circuit substrate) on which the high frequency module 100 is mounted.

In the high frequency module 100 according to the first embodiment, the first substrate 10 configuring the acoustic wave filter 1 is a lithium niobate substrate. However, the first substrate 10 is not necessarily a lithium niobate substrate and may be, for example, a lithium tantalate substrate. In the case where the first substrate 10 is a lithium tantalate substrate, the temperature characteristics of the first substrate 10 are worse than the case where the first substrate 10 is a lithium niobate substrate, and the temperature characteristics of the acoustic wave filter 1 may thus be deteriorated. However, by making the second main surface 12 of the first substrate 10 contact with the shield layer 6 with the protection member 4 interposed therebetween, an increase of the temperature of the first substrate 10 can be reduced, and the stable temperature characteristics of the acoustic wave filter 1 can thus be achieved.

Furthermore, in the high frequency module 100 according to the first embodiment, the second electronic component 2 is the reception filter 122A. However, the second electronic component 2 may be another circuit element such as the power amplifier 111.

In the high frequency module 100 according to the first embodiment, the protection member 4 is a metal block. However, the protection member 4 is not necessarily a metal block. The protection member 4 may be, for example, a sputter film formed by performing sputtering on the second main surface 12 of the first substrate 10 of the acoustic wave filter 1. Thus, the close contactness between the acoustic wave filter 1 and the shield layer 6 can be improved.

In the high frequency module 100 according to the first embodiment, the protection member 4 is a metal block. However, the protection member 4 may be, for example, an insulating material. The insulating material includes, for example, a resin different from the resin layer 5 described above. In this case, the protection member 4 functions as a cushion between the acoustic wave filter 1 and the shield layer 6 and can reduce the influence on the acoustic wave filter 1 in laser printing on the module surface.

(4) Modifications

Hereinafter, modifications of the first embodiment will be described. The modifications described below may be combined in an appropriate manner.

(4.1) First Modification

Figure 5:
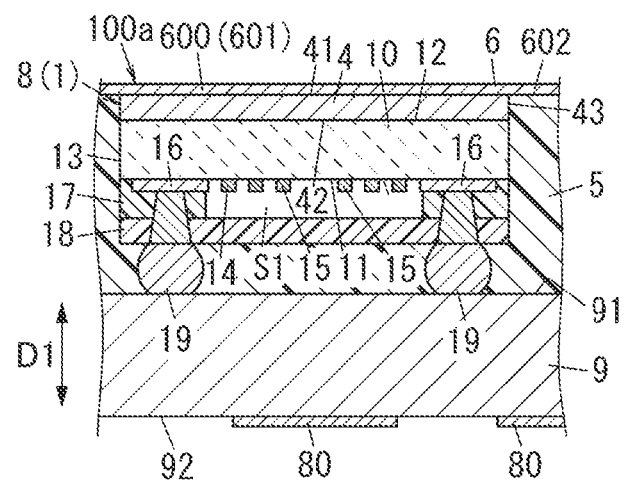
FIG. 5 is a cross-section view of an enlarged part of a high frequency module according to a first modification of the first embodiment.

A high frequency module 100a according to a first modification of the first embodiment will be described with reference to FIG. 5. Component elements of the high frequency module 100a according to the first modification similar to those of the high frequency module 100 according to the first embodiment will be denoted by the same signs and description for those component elements will be omitted.

The high frequency module 100a according to the first modification is different from the high frequency module 100 according to the first embodiment in that the first electronic component 1 configuring the acoustic wave filter 1 includes, as component elements of a first package structure, a first spacer layer 17, a first cover member 18, and a plurality of first terminals 19.

The first spacer layer 17 is provided near the first main surface 11 of the first substrate 10. The first spacer layer 17 surrounds the plurality of IDT electrodes 15 when viewed in plan from the thickness direction D1 of the mounting substrate 9. The first spacer layer 17 has a rectangular frame shape when viewed in plan from the thickness direction D1 of the mounting substrate 9. The first spacer layer 17 has electrical insulating characteristics. The first spacer layer 17 is made of epoxy resin, polyimide, or the like.

The first cover member 18 is provided near the first main surface 11 of the first substrate 10. The first cover member 18 has a flat plate shape. The first cover member 18 is disposed on the first spacer layer 17 in such a manner that the first cover member 18 faces the first substrate 10 in the thickness direction D1 of the mounting substrate 9. The first cover member 18 overlaps with the plurality of IDT electrodes 15 in the thickness direction D1 of the mounting substrate 9 and are away from the plurality of IDT electrodes 15 in the thickness direction D1 of the mounting substrate 9. The first cover member 18 has electrical insulating characteristics. The first cover member 18 is made of epoxy resin, polyimide, or the like.

The first electronic component 1 has a first space S1 that is surrounded by the first substrate 10, the first spacer layer 17, and the first cover member 18. The first space S1 is filled with gas such as air or inert gas (for example, nitrogen gas).

The plurality of first terminals 19 are exposed out of the first cover member 18. Each of the plurality of first terminals 19 is, for example, a bump. The bump is, for example, a solder bump. The bump is not necessarily a solder bump and may be, for example, a gold bump.

In the high frequency module 100a according to the first modification, as in the high frequency module 100 according to the first embodiment, the protection member 4 is disposed between the acoustic wave filter 1 and the shield layer 6 in the thickness direction D1 of the mounting substrate 9. Thus, for example, the influence on the acoustic wave filter 1 in printing on the module surface (shield layer 6) can be reduced by the protection member 4. That is, in the high frequency module 100a according to the first modification, the acoustic wave filter 1 can be protected by the protection member 4, and this allows printing on the module surface to be performed easily.

Furthermore, in the high frequency module 100a according to the first modification, as in the high frequency module 100 according to the first embodiment, the materials of the protection member 4 include copper, and the protection member 4 is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

(4.2) Second Modification

Figure 6:
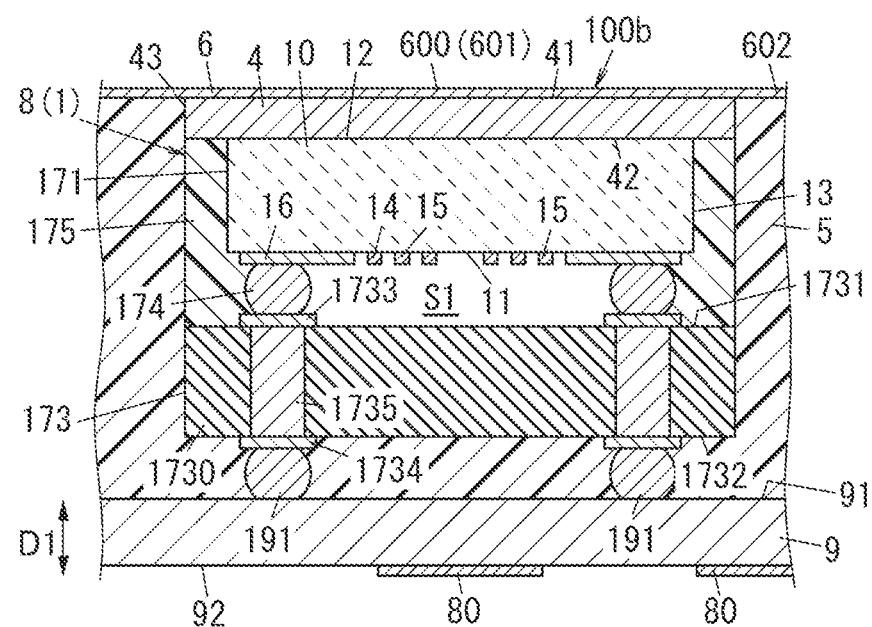
FIG. 6 is a cross-section view of an enlarged part of a high frequency module according to a second modification of the first embodiment.

A high frequency module 100b according to a second modification of the first embodiment will be described with reference to FIG. 6. Component elements of the high frequency module 100b according to the second modification similar to those of the high frequency module 100 according to the first embodiment will be denoted by the same signs and description for those component elements will be omitted.

The high frequency module 100b according to the second modification is different from the high frequency module 100 according to the first embodiment in that the first electronic component 1 configuring the acoustic wave filter 1 includes, as component elements of the first package structure, a first package substrate 173, a plurality of bumps 174, and a first sealing resin unit 175, in addition to a first filter chip 171 including the first substrate 10, the first circuit unit 14, and the plurality of first pad electrodes 16.

The first package substrate 173 includes a first supporting body 1730, a plurality of electrodes 1733, and a plurality of external connection electrodes 1734. The first supporting body 1730 has a flat plate shape and has a first main surface 1731 and a second main surface 1732 that face each other. The plurality of electrodes 1733 are disposed on the first main surface 1731 of the first supporting body 1730. The plurality of external connection electrodes 1734 are disposed on the second main surface 1732 of the first supporting body 1730.

The first package substrate 173 further includes a plurality of through electrodes 1735 that electrically connect the plurality of electrodes 1733 to the plurality of external connection electrodes 1734 in a one-to-one relationship. The first supporting body 1730 has electrical insulating characteristics. The first supporting body 1730 is, for example, a ceramic substrate (for example, an alumina substrate). The outer peripheral shape of the first package substrate 173 is a rectangular shape. However, the first package substrate 173 does not necessarily have a rectangular shape and may have, for example, a square shape.

The plurality of bumps 174 bond the plurality of first pad electrodes 16 of the first filter chip 171 to the plurality of electrodes 1733 of the first package substrate 173.

The first sealing resin unit 175 is disposed on the first package substrate 173 and covers an outer peripheral surface of the first filter chip 171. In the first electronic component 1, the first space S1 surrounded by the first filter chip 171, the first package substrate 173, and the first sealing resin unit 175 is formed.

The first electronic component 1 is an acoustic wave filter of a CSP (Chip Size Package) type. In the first electronic component 1, the first filter chip 171 is flip-chip-mounted on the first package substrate 173, and the outer peripheral surface of the first filter chip 171 on the first package substrate 173 is covered by the first sealing resin unit 175. The size of the first package substrate 173 and the first sealing resin unit 175 in a plan view from the thickness direction of the first filter chip 171 is slightly larger than the chip size of the first filter chip 171.

The high frequency module 100b further includes a plurality of first bumps 191 that are bonded to the plurality of external connection electrodes 1734 of the acoustic wave filter 1 and the mounting substrate 9.

In the high frequency module 100b according to the second modification, the protection member 4 is disposed between the acoustic wave filter 1 and the shield layer 6 in the thickness direction D1 of the mounting substrate 9, as in the high frequency module 100 according to the first embodiment. Thus, for example, the influence on the acoustic wave filter 1 in printing on the module surface (shield layer 6) can be reduced by the protection member 4. That is, in the high frequency module 100b according to the second modification, the acoustic wave filter 1 can be protected by the protection member 4, and this allows printing on the module surface to be performed easily.

Furthermore, in the high frequency module 100b according to the second modification, the materials of the protection member 4 include copper and the protection member 4 is in contact with both the acoustic wave filter 1 and the shield layer 6, as in the high frequency module 100 according to the first embodiment. Thus, the heat generated at the acoustic wave filter 1 can be transferred to the shield layer 6 through the protection member 4. As a result, the heat dissipation characteristics of the acoustic wave filter 1 can be improved.

(4.3) Third Modification

Figure 7:
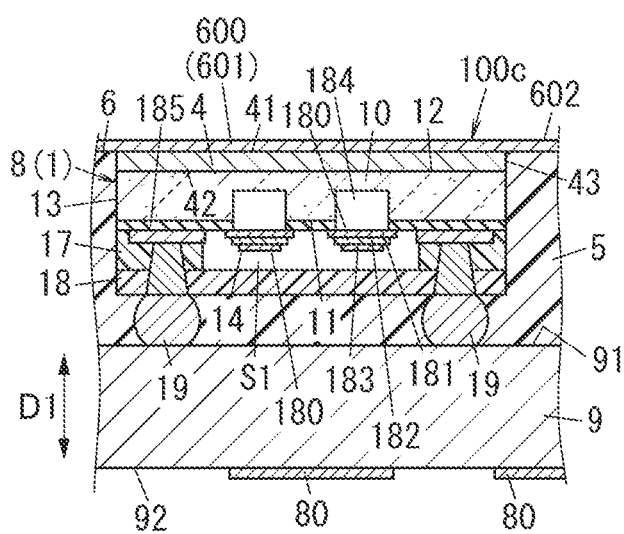
FIG. 7 is a cross-section view of an enlarged part of a high frequency module according to a third modification of the first embodiment.

A high frequency module 100c according to a third modification of the first embodiment will be described with reference to FIG. 7. Component elements of the high frequency module 100c according to the third modification similar to those of the high frequency module 100a according to the first modification of the first embodiment will be denoted by the same signs and description for those component elements will be omitted.

The high frequency module 100c according to the third modification is different from the high frequency module 100a according to the first modification in that the first electronic component 1 configuring the acoustic wave filter 1 is a BAW (Bulk Acoustic Wave) filter.

In the high frequency module 100c according to the third modification, the first substrate 10 of the first electronic component 1 is a silicon substrate, and each of the plurality of acoustic wave resonators is a first BAW (Bulk Acoustic Wave) resonator 180. That is, in the high frequency module 100c according to the third modification, the first substrate 10 is a supporting substrate that is a silicon substrate.

The first BAW resonator 180 includes a first electrode 181, a piezoelectric film 182, and a second electrode 183. The piezoelectric film 182 is formed on the first electrode 181. The second electrode 183 is formed on the piezoelectric film 182.

The first BAW resonator 180 further includes an electrical insulating film 185 formed on the first main surface 11 of the first substrate 10. The electrical insulating film 185 is made of, for example, silicon oxide. The piezoelectric film 182 is made of, for example, AlN, ScAlN, or PZT.

The first BAW resonator 180 has a cavity 184 arranged on a side of the first electrode 181 that is far from the piezoelectric film 182. The first BAW resonator 180 is capable of suppressing the propagation of the acoustic wave energy toward the first substrate 10 by increasing the acoustic impedance ratio between the first electrode 181 and a medium immediately below the first electrode 181 and also is capable of increasing an electromechanical coupling coefficient compared to the case where no cavity 184 is arranged. The first BAW resonator 180 is an FBAR (Film Bulk Acoustic Resonator). In the high frequency module 100c according to the third modification, the first substrate 10 is a supporting substrate that is a silicon substrate, and the main surface (second main surface 12) of the first substrate 10 that is far from the mounting substrate 9 is in contact with the protection member 4, as illustrated in FIG. 7.

In the high frequency module 100c according to the third modification, the protection member 4 is disposed between the acoustic wave filter 1 and the shield layer 6 in the thickness direction D1 of the mounting substrate 9, as in the high frequency module 100a according to the first modification. Thus, for example, the influence on the acoustic wave filter 1 in printing on the module surface (shield layer 6) can be reduced by the protection member 4. That is, in the high frequency module 100c according to the third modification, the acoustic wave filter 1 can be protected by the protection member 4, and this allows printing on the module surface to be performed easily.

Furthermore, in the high frequency module 100c according to the third modification, the materials of the protection member 4 include copper and the protection member 4 is in contact with both the acoustic wave filter 1 and the shield layer 6, as in the high frequency module 100a according to the first modification. Thus, the heat generated at the acoustic wave filter 1 can be transferred to the shield layer 6 through the protection member 4. As a result, the heat dissipation characteristics of the acoustic wave filter 1 can be improved.

(4.4) Fourth Modification

Figure 8:
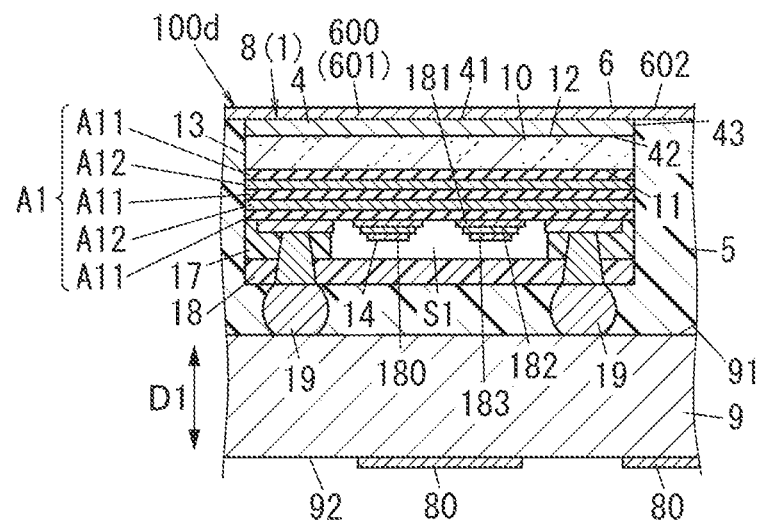
FIG. 8 is a cross-section view of an enlarged part of a high frequency module according to a fourth modification of the first embodiment.

A high frequency module 100d according to a fourth modification of the first embodiment will be described with reference to FIG. 8. Component elements of the high frequency module 100d according to the fourth modification similar to those of the high frequency module 100c according to the third modification of the first embodiment will be denoted by the same signs and description for those component elements will be omitted.

The high frequency module 100d according to the fourth modification is different from the high frequency module 100c according to the third modification in that the first BAW resonators 180 include an acoustic reflector layer A1 interposed between the first substrate 10 and the first electrodes 181 of the first BAW resonators 180. In the high frequency module 100d according to the fourth modification, the first substrate 10 is a supporting substrate that is a silicon substrate.

The acoustic reflector layer A1 is provided on the first main surface 11 of the first substrate 10. The plurality of first electrodes 181 are provided on the acoustic reflector layer A1. The acoustic reflector layer A1 includes at least one (in the example in the drawing, three) low acoustic impedance layers A11 and at least one (in the example in the drawing, two) high acoustic impedance layers A12. The acoustic impedance of the low acoustic impedance layers A11 is lower than the acoustic impedance of the high acoustic impedance layers A12.

In the high frequency module 100d according to the fourth modification, the first BAW resonators 180 are SMRs (Solidly Mounted Resonators). The plurality of high acoustic impedance layers A12 are made of, for example, platinum. The plurality of low acoustic impedance layers A11 are made of, for example, silicon oxide. The plurality of high acoustic impedance layers A12 are not necessarily made of platinum and may be made of metal such as tungsten or tantalum. Furthermore, the plurality of high acoustic impedance layers A12 are not necessarily made of metal and may be made of, for example, an insulator. The plurality of high acoustic impedance layers A12 are not necessarily made of the same materials and may be made of, for example, different materials. Furthermore, the plurality of low acoustic impedance layers A11 are not necessarily made of the same materials and may be made of, for example, different materials. Furthermore, the number of the high acoustic impedance layers A12 and the number of the low acoustic impedance layers A11 are not necessarily different and may be the same.

In the high frequency module 100d according to the fourth modification, the protection member 4 is disposed between the acoustic wave filter 1 and the shield layer 6 in the thickness direction D1 of the mounting substrate 9, as in the high frequency module 100c according to the third modification. Thus, for example, the influence on the acoustic wave filter 1 in printing on the module surface (shield layer 6) can be reduced by the protection member 4. That is, in the high frequency module 100d according to the fourth modification, the acoustic wave filter 1 can be protected by the protection member 4, and this allows printing on the module surface to be performed easily.

Furthermore, in the high frequency module 100d according to the fourth modification, the materials of the protection member 4 include copper and the protection member 4 is in contact with both the acoustic wave filter 1 and the shield layer 6, as in the high frequency module 100c according to the third modification. Thus, the heat generated at the acoustic wave filter 1 can be transferred to the shield layer 6 through the protection member 4. As a result, the heat dissipation characteristics of the acoustic wave filter 1 can be improved.

(4.5) Fifth Modification

Figure 9:
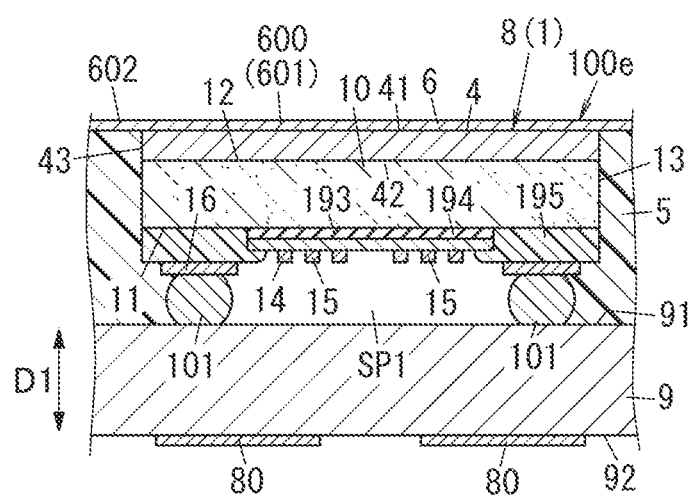
FIG. 9 is a cross-section view of an enlarged part of a high frequency module according to a fifth modification of the first embodiment.

A high frequency module 100e according to a fifth modification of the first embodiment will be described with reference to FIG. 9. Component elements of the high frequency module 100e according to the fifth modification similar to those of the high frequency module 100 according to the first embodiment will be denoted by the same signs and description for those component elements will be omitted.

The first electronic component 1 configuring the acoustic wave filter 1 is a bare-chip acoustic wave filter. The first electronic component 1 includes, as illustrated in FIG. 9, the first substrate 10, a low acoustic velocity film 193, a piezoelectric layer 194, the plurality of IDT electrodes 15, and the plurality of pad electrodes 16. The low acoustic velocity film 193 is provided on the first main surface 11 of the first substrate 10. The piezoelectric layer 194 is provided on the low acoustic velocity film 193. The plurality of IDT electrodes 15 are provided on the piezoelectric layer 194. The plurality of pad electrodes 16 are provided on the first main surface 11 of the first substrate 10. The first electronic component 1 has a rectangular shape when viewed in plan from the thickness direction thereof. However, the first electronic component 1 does not necessarily have a rectangular shape and may have, for example, a square shape.

The low acoustic velocity film 193 is positioned away from the outer periphery of the first substrate 10 when viewed in plan from the thickness direction of the acoustic wave filter 1. The acoustic wave filter 1 further includes an insulating layer 195. The insulating layer 195 covers a region of the first main surface 11 of the first substrate 10 that is not covered with the low acoustic velocity film 193. The insulating layer 195 has electrical insulating characteristics. The insulating layer 195 is formed along the outer periphery of the first substrate 10 on the first main surface 11 of the first substrate 10. The insulating layer 195 surrounds the plurality of IDT electrodes 15. The insulating layer 195 has a frame shape (for example, a rectangular frame shape) when viewed in plan from the thickness direction of the acoustic wave filter 1. Part of the insulating layer 195 overlaps with an outer peripheral part of the piezoelectric layer 194 in the thickness direction of the acoustic wave filter 1. The outer peripheral surface of the piezoelectric layer 194 and the outer peripheral surface of the low acoustic velocity film 193 are covered with the insulating layer 195. The insulating layer 195 is made of epoxy resin, polyimide, or the like.

The plurality of pad electrodes 16 are provided on the first main surface 11 of the first substrate 10 with the insulating layer 195 interposed therebetween.

The piezoelectric layer 194 is made of, for example, lithium niobate or lithium tantalate. The low acoustic velocity film 193 is made of, for example, silicon oxide. The acoustic velocity of the bulk waves propagating in the low acoustic velocity film 193 is lower than the acoustic velocity of the bulk waves propagating in the piezoelectric layer 194. The low acoustic velocity film 193 is not necessarily made of silicon oxide and may be made of, for example, silicon oxide, glass, silicon oxynitride, tantalum oxide, a compound obtained by adding fluorine, carbon, or boron to silicon oxide, or a material containing any of the materials mentioned above as a main component.

The first substrate 10 is, for example, a silicon substrate. The acoustic velocity of the bulk waves propagating in the first substrate 10 is higher than the acoustic velocity of the acoustic waves propagating in the piezoelectric layer 194. A bulk wave propagating in the first substrate 10 is the bulk wave of the lowest acoustic velocity among a plurality of bulk waves propagating in the first substrate 10. In the high frequency module 100e according to the fifth modification, the first substrate 10 and the low acoustic velocity film 193 provided on the first substrate 10 configure a high acoustic velocity member. Furthermore, in the high frequency module 100e according to the fifth modification, the first substrate 10 is a supporting substrate that is a silicon substrate. In the high frequency module 100e according to the fifth modification, the main surface (second main surface 12) of the first substrate 10 that is far from the mounting substrate 9 is in contact with the protection member 4.

The thickness of the piezoelectric layer 194 is, for example, 3.5λ or less, where the wavelength of an acoustic wave defined by an electrode finger period of the IDT electrodes 15 is represented by λ. The thickness of the low acoustic velocity film 193 is, for example, 2.0λ or less.

The acoustic wave filter 1 may further include a high acoustic velocity film provided between the first substrate 10 and the low acoustic velocity film 193. The acoustic velocity of the bulk waves propagating in the high acoustic velocity film is higher than the acoustic velocity of the acoustic waves propagating in the piezoelectric layer 194. The high acoustic velocity film is made of, for example, a material of at least one type selected from a group including diamond-like carbon, aluminum nitride, aluminum oxide, silicon carbide, silicon nitride, silicone, sapphire, piezoelectric body (lithium tantalate, lithium niobate, or quartz), alumina, zirconia, cordierite, mullite, steatite, forsterite, magnesia, and diamond. A material of the high acoustic velocity film may be a material containing any of the materials mentioned above as a main component or a material containing a mixture including any of the materials mentioned above as a main component.

The acoustic wave filter 1 may include a close contact layer interposed between the low acoustic velocity film 193 and the piezoelectric layer 194. The close contact layer is made of, for example, resin (epoxy resin or polyimide resin). Furthermore, the acoustic wave filter 1 may include a dielectric film between the low acoustic velocity film 193 and the piezoelectric layer 194, above the piezoelectric layer 194, or below the low acoustic velocity film 193.

In the high frequency module 100e according to the fifth modification, the protection member 4 is disposed between the acoustic wave filter 1 and the shield layer 6 in the thickness direction D1 of the mounting substrate 9, as in the high frequency module 100 according to the first embodiment. Thus, for example, the influence on the acoustic wave filter 1 in printing on the module surface (shield layer 6) can be reduced by the protection member 4. That is, in the high frequency module 100e according to the fifth modification, the acoustic wave filter 1 can be protected by the protection member 4, and this allows printing on the module surface to be performed easily.

Furthermore, in the high frequency module 100e according to the fifth modification, the materials of the protection member 4 include copper and the protection member 4 is in contact with both the acoustic wave filter 1 and the shield layer 6, as in the high frequency module 100 according to the first embodiment. Thus, the heat generated at the acoustic wave filter 1 can be transferred to the shield layer 6 through the protection member 4. As a result, the heat dissipation characteristics of the acoustic wave filter 1 can be improved.

(4.6) Sixth Modification

Figure 10:
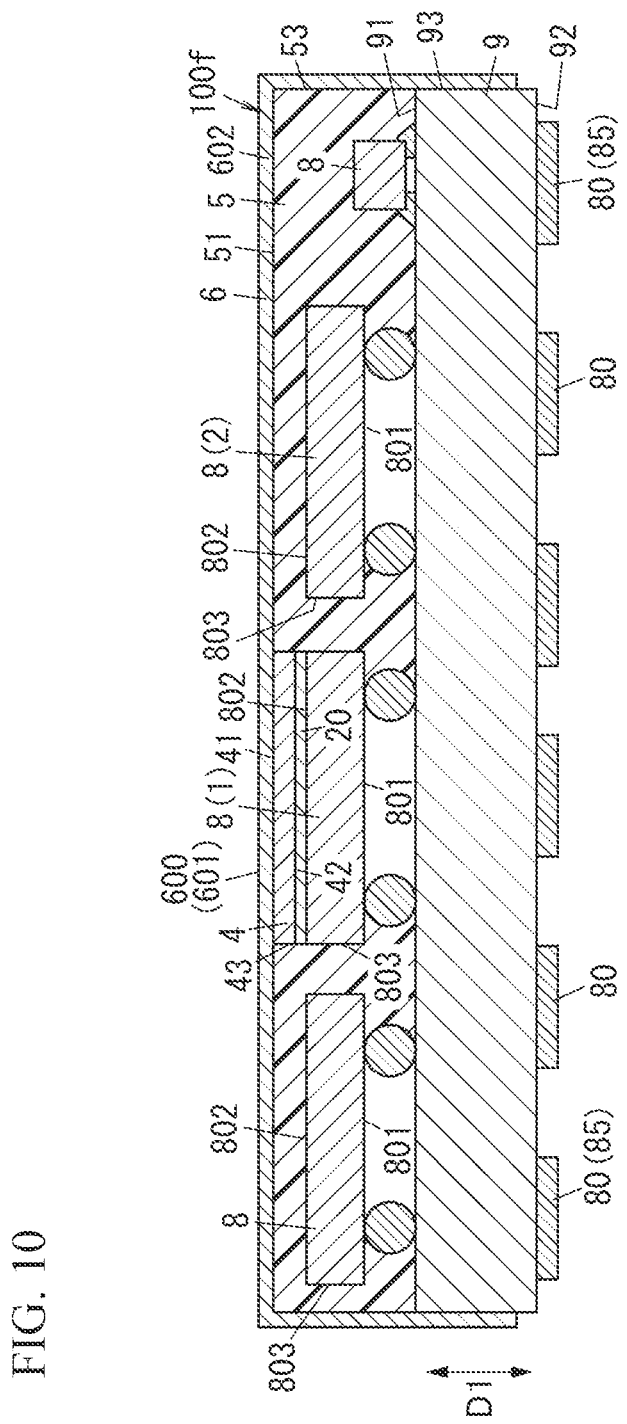
FIG. 10 is a cross-section view of a high frequency module according to a sixth modification of the first embodiment.

A high frequency module 100f according to a sixth modification of a first embodiment will be described with reference to FIG. 10. Component elements of the high frequency module 100f according to the sixth modification similar to those of the high frequency module 100 according to the first embodiment will be denoted by the same signs and description for those component elements will be omitted.

The high frequency module 100f according to the sixth modification is different from the high frequency module 100 according to the first embodiment in including an adhesion layer 20 that bonds the protection member 4 to the acoustic wave filter 1.

The adhesion layer 20 is, for example, Ag paste. The adhesion layer 20 is disposed between the acoustic wave filter 1 and the protection member 4 in the thickness direction D1 of the mounting substrate 9. Thus, the acoustic wave filter 1 and the protection member 4 are bonded together with the adhesion layer 20 interposed therebetween. In the high frequency module 100f according to the sixth modification, the protection member 4 can be fixed to the acoustic wave filter 1 more firmly.

Second Embodiment

A high frequency module 100h according to a second embodiment will be described with reference to FIG. 11.

Component elements of the high frequency module 100*h* according to the second embodiment similar to those of the high frequency module 100 according to the first embodiment will be denoted by the same signs and description for those component elements will be omitted. The circuit configuration of the high frequency module 100*h* is similar to the circuit configuration of the high frequency module 100 according to the first embodiment described above with reference to FIG. 1.

In the high frequency module 100*h* according to the second embodiment, the first electronic component 1 is an acoustic wave filter (hereinafter, may also be referred to as an "acoustic wave filter 1"). The first electronic component 1 is the transmission filter 112A provided on the signal path T1 (see FIG. 1) for transmission signals. The second electronic component 2 is the reception filter 122A provided on the signal path R1 (see FIG. 1) for reception signals.

The protection member 4 is disposed between the first electronic component (acoustic wave filter) 1 and the shield layer 6 in the thickness direction D1 of the mounting substrate 9. The first main surface 41, which is the main surface of the protection member 4 that is far from the mounting substrate 9, protrudes, in a direction away from the mounting substrate 9 (toward the shield layer 6), relative to the main surface 51 of the resin layer 5 that is far from the mounting substrate 9. As a result, the first main surface 41 of the protection member 4 is in contact with the shield layer 6, and part of the outer peripheral surface 43 of protection member 4 is in contact with the shield layer 6. That is, in the high frequency module 100*h* according to the second embodiment, the shield layer 6 is in contact with the first main surface 41 of the protection member 4 and part of the outer peripheral surface 43.

Figure 11:
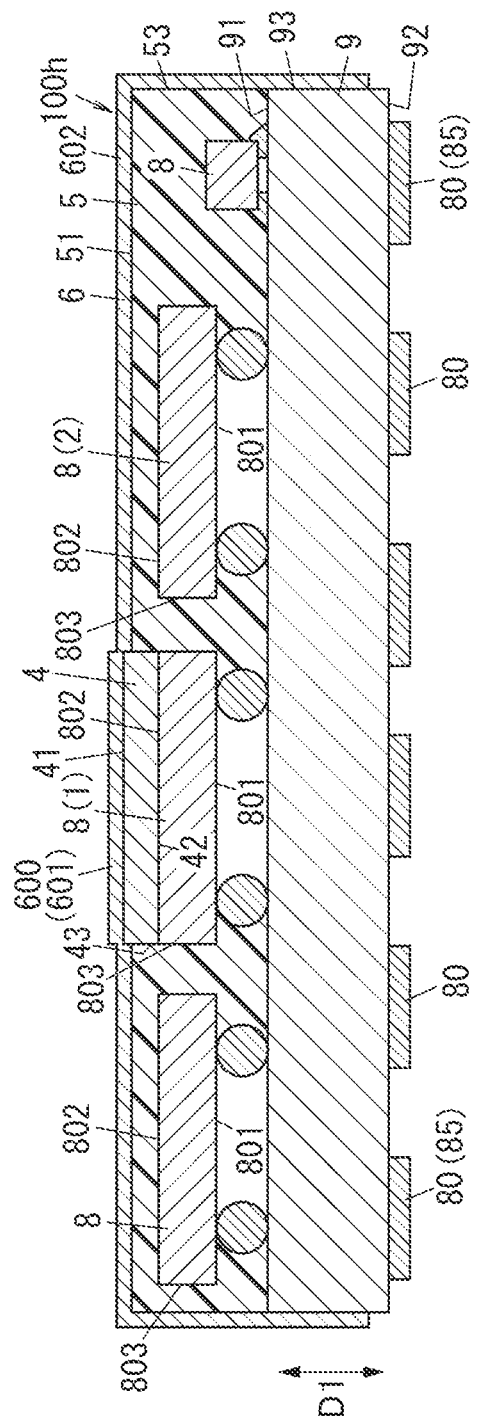
FIG. 11 is a cross-section view of a high frequency module according to a second embodiment.

In the high frequency module 100*h* according to the second embodiment, the shield layer 6 includes the first part 601 and the second part 602, as illustrated in FIG. 11. The first part 601 is a part of the shield layer 6 that overlaps with the protection member 4 in the thickness direction D1 of the mounting substrate 9. The second part 602 is a part of the shield layer 6 that does not overlap with the protection member 4 in the thickness direction D1 of the mounting substrate 9. In the high frequency module 100*h* according to the second embodiment, the first part 601 protrudes, in a direction away from the mounting substrate 9 (toward the shield layer 6) relative to the second part 602, in the thickness direction D1 of the mounting substrate 9.

In the high frequency module 100*h* according to the second embodiment, as described above, the protection member 4 is disposed between the acoustic wave filter 1 and the shield layer 6. Thus, for example, the influence on the acoustic wave filter 1 in printing on the module surface (shield layer 6) can be reduced by the protection member 4. That is, in the high frequency module 100*h* according to the second embodiment, the acoustic wave filter 1 can be protected by the protection member 4, and this allows printing on the module surface to be performed easily.

Furthermore, in the high frequency module 100*h* according to the second embodiment, the protection member 4 is made of copper and is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

Furthermore, in the high frequency module 100*h* according to the second embodiment, as described above, in the thickness direction D1 of the mounting substrate 9, the first part 601 of the shield layer 6 protrudes, in the direction away from the mounting substrate 9, relative to the second part 602. Thus, the first part 601 and the second part 602 can be distinguished from each other, and printing can be performed on the first part 601 that overlaps with the protection member 4.

Third Embodiment

A high frequency module 100*i* according to a third embodiment will be described with reference to FIG. 12. Component elements of the high frequency module 100*i* according to the third embodiment similar to those of the high frequency module 100 according to the first embodiment will be denoted by the same signs and description for those component elements will be omitted. The circuit configuration of the high frequency module 100*i* is similar to the circuit configuration of the high frequency module 100 according to the first embodiment described above with reference to FIG. 1.

In the high frequency module 100*i* according to the third embodiment, the first electronic component 1 is an acoustic wave filter (hereinafter, may also be referred to as an "acoustic wave filter 1"). The first electronic component 1 is the transmission filter 112A provided on the signal path T1 (see FIG. 1) for transmission signals. The second electronic component 2 is the reception filter 122A provided on the signal path R1 (see FIG. 1) for reception signals.

Figure 12:
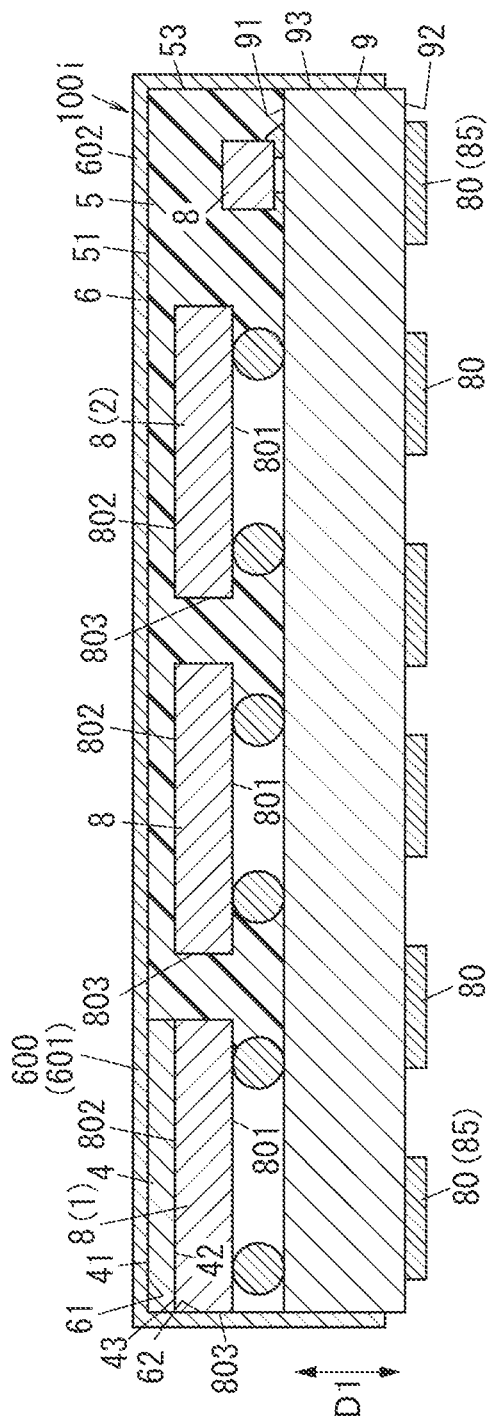
FIG. 12 is a cross-section view of a high frequency module according to a third embodiment.

In the high frequency module 100*i* according to the third embodiment, as illustrated in FIG. 12, the protection member 4 is disposed between the acoustic wave filter 1 and the shield layer 6 in the thickness direction D1 of the mounting substrate 9. Furthermore, in the high frequency module 100*i* according to the third embodiment, the shield layer 6 is in contact with the first main surface 41, which is the main surface of the protection member 4 that is far from the mounting substrate 9, and the outer peripheral surface 43 along the thickness direction D1 of the mounting substrate 9. That is, the shield layer 6 includes a first contact part 61 that is in contact with the first main surface 41, which is the main surface of the protection member 4 that is far from the mounting substrate 9, and a second contact part 62 that is in contact with the outer peripheral surface 43 along the thickness direction D1 of the mounting substrate 9. Furthermore, in the high frequency module 100*i* according to the third embodiment, the first main surface 41 of the protection member 4 and the main surface 51 of the resin layer 5 that is far from the mounting substrate 9 are substantially on the same plane.

In the high frequency module 100*i* according to the third embodiment, the first main surface 41 and the outer peripheral surface 43 of the protection member 4 are in contact with the shield layer 6. Thus, the close contactness between the protection member 4 and the shield layer 6 can be improved. Furthermore, in the high frequency module 100*i* according to the third embodiment, the heat generated at the acoustic wave filter 1 can be transferred to the shield layer 6 through the first main surface 41 and the outer peripheral surface 43 of the protection member 4, and the heat dissipation characteristics of the acoustic wave filter 1 can further be improved.

Furthermore, in the high frequency module 100*i* according to the third embodiment, as described above, the protection member 4 is disposed between the acoustic wave filter 1 and the shield layer 6. Thus, for example, the influence on the acoustic wave filter 1 in printing on the module surface (shield layer 6) can be reduced by the protection member 4. That is, in the high frequency module 100i according to the third embodiment, the acoustic wave filter 1 can be protected by the protection member 4, and this allows printing on the module surface to be performed easily.

In the high frequency module 100i according to the third embodiment, the first main surface 41 of the protection member 4 and the main surface 51 of the resin layer 5 are substantially on the same plane. However, the first main surface 41 of the protection member 4 may protrude relative to the main surface 51 of the resin layer 5 in a direction away from the mounting substrate 9.

Fourth Embodiment

A high frequency module 100j according to a fourth embodiment will be described with reference to FIG. 13. Component elements of the high frequency module 100j according to the fourth embodiment similar to those of the high frequency module 100 according to the first embodiment will be denoted by the same signs and description for those component elements will be omitted. The circuit configuration of the high frequency module 100j is similar to the circuit configuration of the high frequency module 100 according to the first embodiment described above with reference to FIG. 1.

In the high frequency module 100j according to the fourth embodiment, the first electronic component 1 is an acoustic wave filter (hereinafter, may also be referred to as an "acoustic wave filter 1"). The first electronic component 1 is the transmission filter 112A provided on the signal path T1 (see FIG. 1) for transmission signals. The second electronic component 2 is the reception filter 122A provided on the signal path R1 (see FIG. 1) for reception signals.

In the high frequency module 100j according to the fourth embodiment, the first electronic component (acoustic wave filter) 1 is mounted on the first main surface 91 of the mounting substrate 9 with a plurality of first bumps 201 interposed therebetween. Furthermore, other electronic components 8 including the second electronic component 2 are mounted on the first main surface 91 of the mounting substrate 9 with a plurality of second bumps 202 interposed therebetween.

Figure 13:
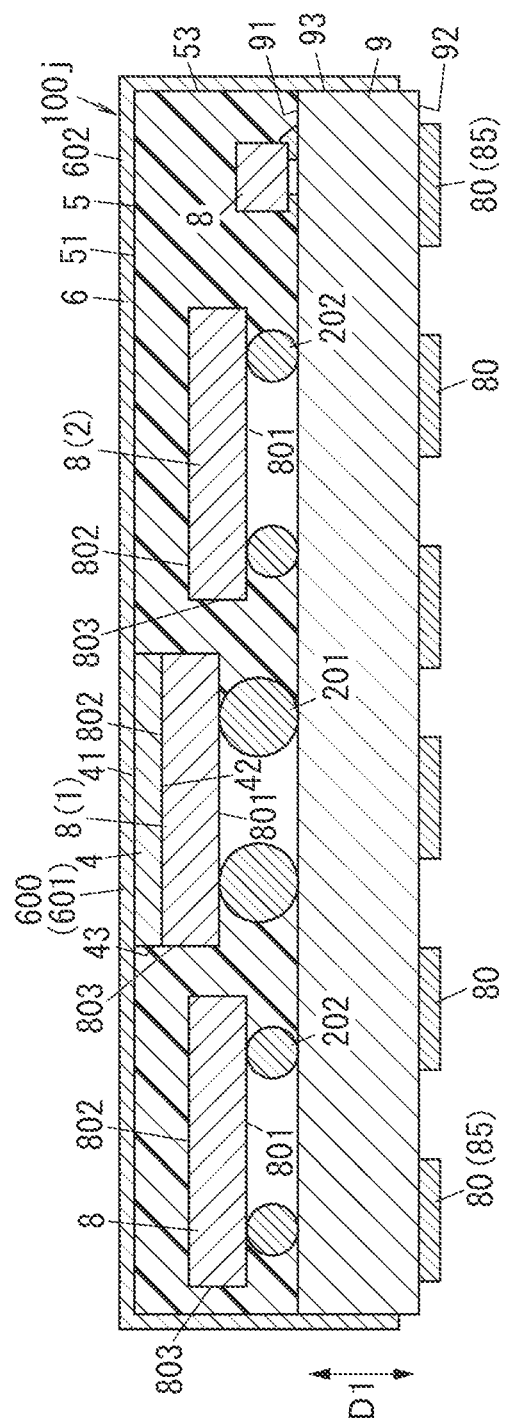
FIG. 13 is a cross-section view of a high frequency module according to a fourth embodiment.

In the high frequency module 100j according to the fourth embodiment, as illustrated in FIG. 13, the size of each of the plurality of first bumps 201 is larger than the size of each of the plurality of second bumps 202. Specifically, the diameter of each of the first bumps 201 is, for example, 180 nanometers, and the diameter of each of the second bumps 202 is, for example, 80 nanometers. Furthermore, in the high frequency module 100j according to the fourth embodiment, the thickness of a substrate configuring the first electronic component 1 and the thickness of a substrate configuring the second electronic component 2 are substantially the same.

In the high frequency module 100j according to the fourth embodiment, by making the size of the first bumps 201 larger than the size of the second bumps 202, the protection member 4 that is located on the first electronic component 1 can be made in contact with the shield layer 6 even if the substrate configuring the first electronic component 1 and the substrate configuring the second electronic component 2 have the same thickness.

In the high frequency module 100j according to the fourth embodiment, in a state in which the first electronic component 1 and the second electronic component 2 are mounted on the mounting substrate 9, the first main surface 801 of the first electronic component (acoustic wave filter) 1 that is near the mounting substrate 9 is farther away from the mounting substrate 9 than the first main surface 801 of the second electronic component 2 that is near the mounting substrate 9 is.

In the high frequency module 100j according to the fourth embodiment, by making the size of the first bumps 201 larger than the size of the second bumps 202, the first main surface 41 of the protection member 4 can be made in contact with the shield layer 6, and the heat generated at the first electronic component 1 can be transferred to the shield layer 6 through the protection member 4. Thus, the heat dissipation characteristics of the acoustic wave filter 1 can be improved.

Furthermore, in the high frequency module 100j according to the fourth embodiment, the protection member 4 is disposed between the acoustic wave filter 1 and the shield layer 6 in the thickness direction D1 of the mounting substrate 9. Thus, for example, the influence on the acoustic wave filter 1 in printing on the module surface (shield layer 6) can be reduced by the protection member 4. That is, in the high frequency module 100j according to the fourth embodiment, the acoustic wave filter 1 can be protected by the protection member 4, and this allows printing on the module surface to be performed easily.

Furthermore, in the high frequency module 100j according to the fourth embodiment, as described above, the position of the first main surface 801 of the first electronic component 1 and the position of the first main surface 801 of the second electronic component 2 are different. In the case where each of the first electronic component 1 and the second electronic component 2 is a filter as in the high frequency module 100j according to the fourth embodiment, the interference of a signal between the first electronic component 1 and the second electronic component 2 can be reduced. In the high frequency module 100j according to the fourth embodiment, the second electronic component 2 is a second element.

In the high frequency module 100j according to the fourth embodiment, by changing the size of the first bumps 201, the position of the first electronic component 1 relative to the mounting substrate 9 is changed. However, the size of the first bumps 201 is not necessarily changed to change the position of the first electronic component 1 relative to the mounting substrate 9. For example, a plurality of bumps with the same size as the second bumps 202 may be arranged in the thickness direction D1 of the mounting substrate 9 so that the position of the first electronic component 1 relative to the mounting substrate 9 is changed.

Furthermore, in the high frequency module 100j according to the fourth embodiment, the first main surface 41 of the protection member 4 and the main surface 51 of the resin layer 5 are substantially on the same plane. However, the first main surface 41 of the protection member 4 may protrude relative to the main surface 51 of the resin layer 5 in a direction away from the mounting substrate 9.

Fifth Embodiment

Figure 14:
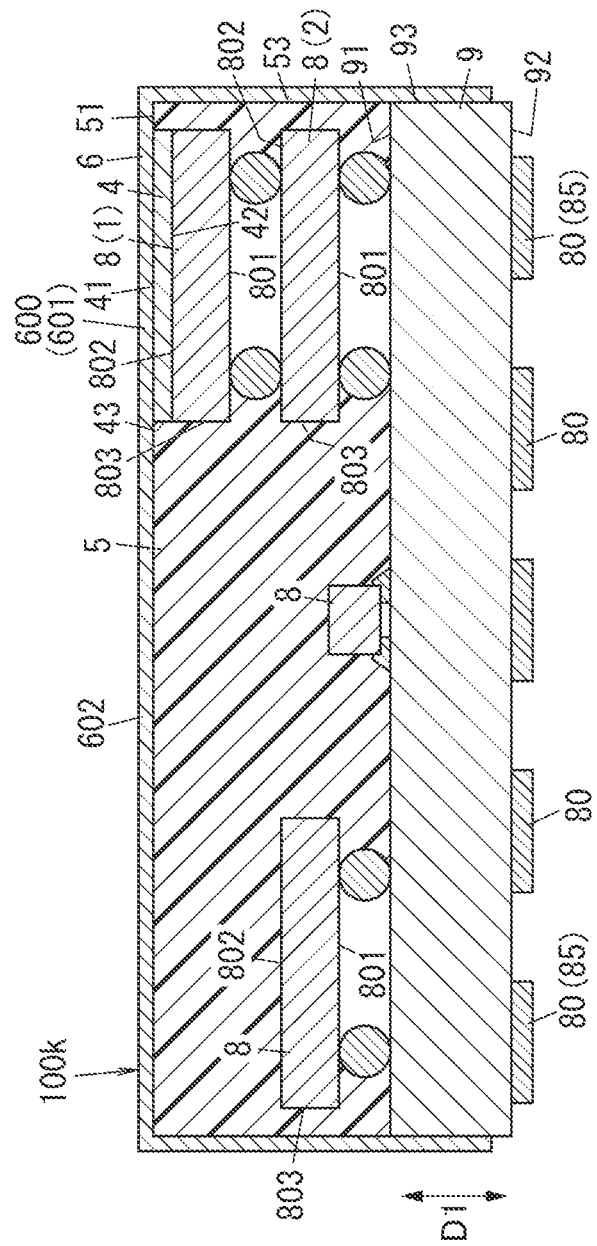
FIG. 14 is a cross-section view of a high frequency module according to a fifth embodiment.

A high frequency module 100k according to a fifth embodiment will be described with reference to FIG. 14. Component elements of the high frequency module 100k according to the fifth embodiment similar to those of the high frequency module 100 according to the first embodiment will be denoted by the same signs and description for those component elements will be omitted. The circuit configuration of the high frequency module 100k is similar to the circuit configuration of the high frequency module 100 according to the first embodiment described above with reference to FIG. 1.

In the high frequency module 100k according to the fifth embodiment, the first electronic component 1 is an acoustic wave filter (hereinafter, may also be referred to as an "acoustic wave filter 1"). The first electronic component 1 is the transmission filter 112A provided on the signal path T1 (see FIG. 1) for transmission signals. The second electronic component 2 is the reception filter 122A provided on the signal path R1 (see FIG. 1) for reception signals.

The second electronic component 2 is mounted on the first main surface 91 of the mounting substrate 9. The first electronic component 1 is mounted on the second main surface 802 of the second electronic component 2. That is, in the high frequency module 100k according to the fifth embodiment, the first electronic component 1 and the second electronic component 2 are stacked on the first main surface 91 of the mounting substrate 9. Furthermore, in the high frequency module 100k according to the fifth embodiment, the protection member 4 is disposed between the acoustic wave filter 1 and the shield layer 6 in the thickness direction D1 of the mounting substrate 9 and is in contact with both the acoustic wave filter 1 and the shield layer 6. Furthermore, in the high frequency module 100k according to the fifth embodiment, the first main surface 41, which is the main surface of the protection member 4 that is far from the mounting substrate 9, and the main surface 51 of the resin layer 5 that is far from the mounting substrate 9 are substantially on the same plane. In the high frequency module 100k according to the fifth embodiment, the second electronic component 2 is a high frequency element.

In the high frequency module 100k according to the fifth embodiment, the protection member 4 is disposed between the acoustic wave filter 1 and the shield layer 6 in the thickness direction D1 of the mounting substrate 9. Thus, for example, the influence on the acoustic wave filter 1 in printing on the module surface (shield layer 6) can be reduced by the protection member 4. That is, in the high frequency module 100k according to the fifth embodiment, the acoustic wave filter 1 can be protected by the protection member 4, and this allows printing on the module surface to be performed easily.

Furthermore, in the high frequency module 100k according to the fifth embodiment, the materials of the protection member 4 include copper, and the protection member 4 is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

In particular, out of the transmission filter 112A configured as the first electronic component 1 and the reception filter 122A configured as the second electronic component 2, the transmission filter 112A, which has a relatively large amount of heat generation, is in contact with the shield layer 6 with the protection member 4 interposed therebetween. Thus, the stable temperature characteristics of the high frequency module 100k can be achieved. Furthermore, by causing the heat generated at the transmission filter 112A to be dissipated through the protection member 4 and the shield layer 6, the thermal diffusion to other electronic components 8 (including the second electronic component 2 as the reception filter 122A) can be reduced, and the variations in the characteristics of the other electronic components 8 can be reduced.

Furthermore, in the high frequency module 100k according to the fifth embodiment, the first electronic component 1 is mounted on the second main surface 802 of the second electronic component 2. Thus, compared to the case where both the first electronic component 1 and the second electronic component 2 are mounted on the first main surface 91 of the mounting substrate 9, the area of the first main surface 91 of the mounting substrate 9 can be made small, and the size reduction when viewed from the thickness direction D1 of the mounting substrate 9 can be achieved.

Sixth Embodiment

A high frequency module 100m according to a sixth embodiment will be described with reference to FIG. 15. Component elements of the high frequency module 100m according to the sixth embodiment similar to those of the high frequency module 100k according to the fifth embodiment will be denoted by the same signs and description for those component elements will be omitted. The circuit configuration of the high frequency module 100m is similar to the circuit configuration of the high frequency module 100 according to the first embodiment described above with reference to FIG. 1.

In the high frequency module 100m according to the sixth embodiment, the first electronic component 1 is an acoustic wave filter (hereinafter, may also be referred to as an "acoustic wave filter 1"). The first electronic component 1 is the transmission filter 112A provided on the signal path T1 (see FIG. 1) for transmission signals. The second electronic component 2 is the reception filter 122A provided on the signal path R1 (see FIG. 1) for reception signals.

The second electronic component 2 is mounted on the first main surface 91 of the mounting substrate 9. The first electronic component 1 is mounted on the second main surface 802 of the second electronic component 2. That is, in the high frequency module 100m according to the sixth embodiment, the first electronic component 1 and the second electronic component 2 are stacked on the first main surface 91 of the mounting substrate 9. Furthermore, in the high frequency module 100m according to the sixth embodiment, the protection member 4 is disposed between the acoustic wave filter 1 and the shield layer 6 in the thickness direction D1 of the mounting substrate 9 and is in contact with both the acoustic wave filter 1 and the shield layer 6. In the high frequency module 100m according to the sixth embodiment, the second electronic component 2 is a high frequency element.

Furthermore, in the high frequency module 100m according to the sixth embodiment, in the thickness direction D1 of the mounting substrate 9, the first main surface 41, which is the main surface of the protection member 4 that is far from the mounting substrate 9, protrudes, in a direction away from the mounting substrate 9 (toward the shield layer 6), relative to the main surface 51 of the resin layer 5 that is far from the mounting substrate 9. Therefore, the first main surface 41 of the protection member 4 is in contact with the shield layer 6, and part of the outer peripheral surface 43 of the protection member 4 is in contact with the shield layer 6. That is, in the high frequency module 100m according to the sixth embodiment, the shield layer 6 is in contact with the first main surface 41 of the protection member 4 and part of the outer peripheral surface 43 of the protection member 4. Thus, compared to the case where only the first main surface 41 of the protection member 4 is in contact with the shield layer 6, the heat dissipation characteristics of the acoustic wave filter 1 can further be improved.

Figure 15:
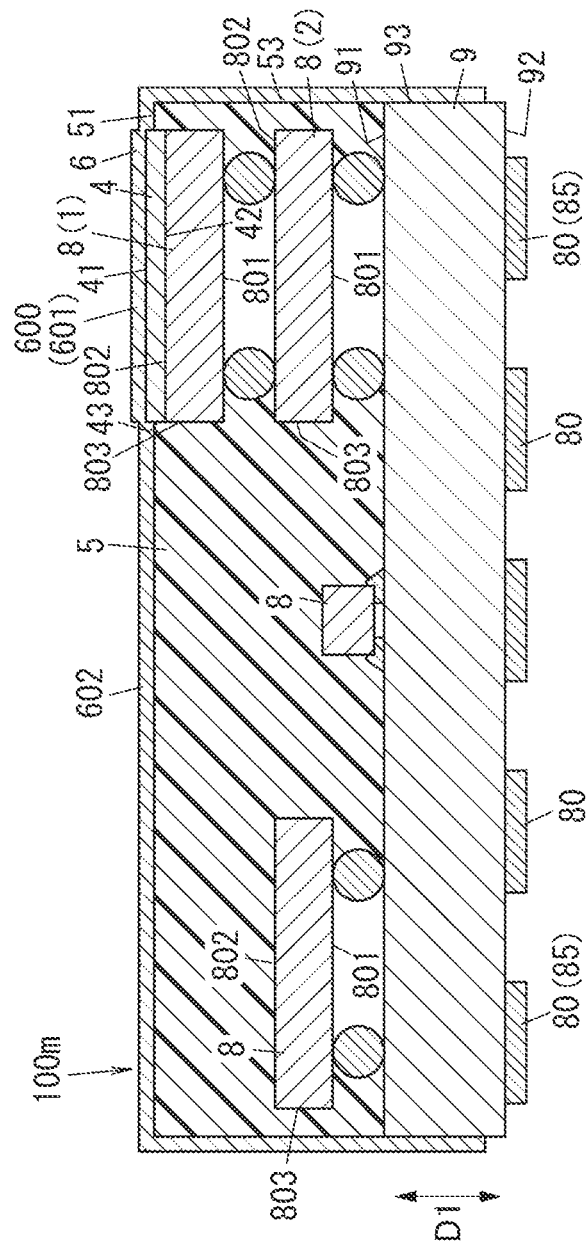
FIG. 15 is a cross-section view of a high frequency module according to a sixth embodiment.

Furthermore, in the high frequency module 100m according to the sixth embodiment, the shield layer 6 includes the first part 601 and the second part 602, as illustrated in FIG. 15. The first part 601 is a part of the shield layer 6 that overlaps with the protection member 4 in the thickness direction D1 of the mounting substrate 9. The second part 602 is a part of the shield layer 6 that does not overlap with the protection member 4 in the thickness direction D1 of the mounting substrate 9. In the high frequency module 100m according to the sixth embodiment, the first part 601 protrudes in the direction away from the mounting substrate 9, relative to the second part 602, in the thickness direction D1 of the mounting substrate 9. Thus, the first part 601 and the second part 602 can be distinguished from each other, and printing can be performed on the first part 601 that overlaps with the protection member 4.

Seventh Embodiment

Figure 16:
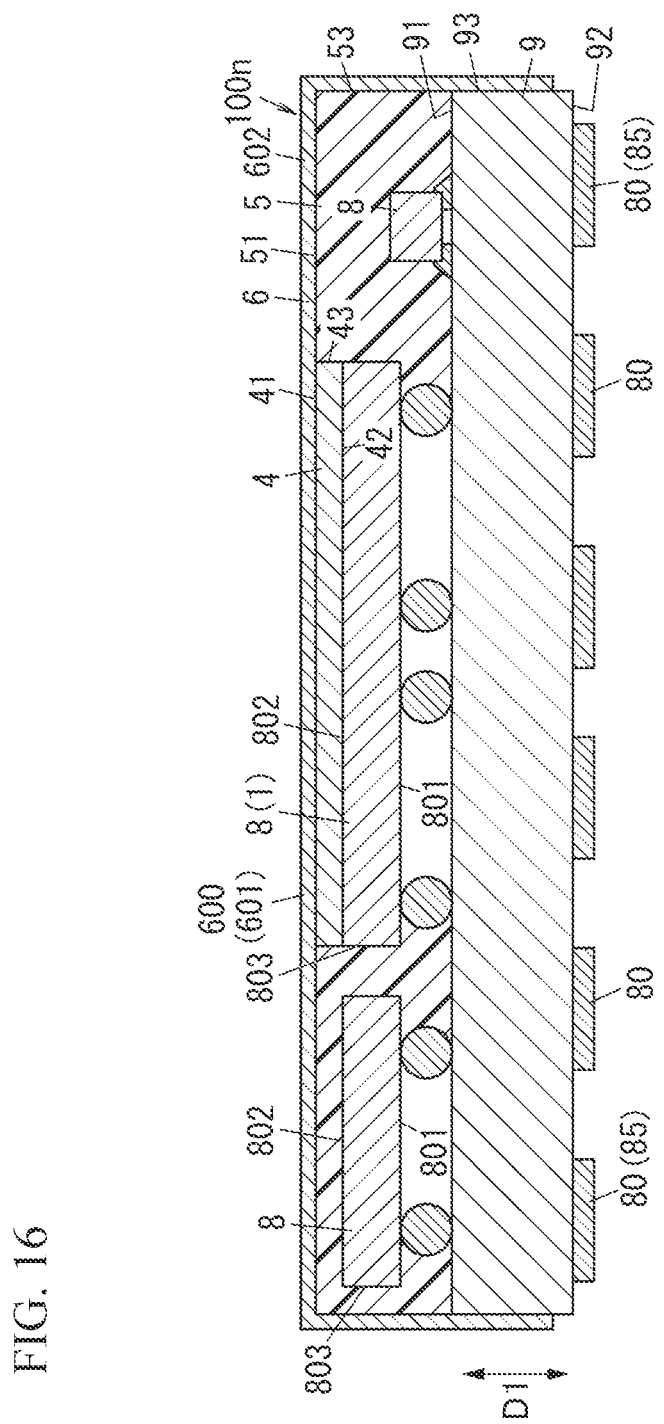
FIG. 16 is a cross-section view of a high frequency module according to a seventh embodiment.

A high frequency module 100n according to a seventh embodiment will be described with reference to FIG. 16. Component elements of the high frequency module 100n according to the seventh embodiment similar to those of the high frequency module 100 according to the first embodiment will be denoted by the same signs and description for those component elements will be omitted. The circuit configuration of the high frequency module 100n is similar to the circuit configuration of the high frequency module 100 according to the first embodiment described above with reference to FIG. 1.

In the high frequency module 100n according to the seventh embodiment, the first electronic component 1 is, for example, a single-chip electronic component including the transmission filter 112A and the reception filter 122A. Thus, in the high frequency module 100n according to the seventh embodiment, compared to the high frequency module 100 according to the first embodiment, the area of the first main surface 91 of the mounting substrate 9 can be made small, and the size reduction when viewed from the thickness direction D1 of the mounting substrate 9 can be achieved. In the high frequency module 100n according to the seventh embodiment, the transmission filter 112A, out of the transmission filter 112A and the reception filter 122A included in the first electronic component 1, is an acoustic wave filter (hereinafter, may also be referred to as an "acoustic wave filter 1").

Furthermore, in the high frequency module 100n according to the seventh embodiment, the protection member 4 is disposed between the acoustic wave filter 1 and the shield layer 6 in the thickness direction D1 of the mounting substrate 9. Thus, for example, the influence on the acoustic wave filter 1 in printing on the module surface (shield layer 6) can be reduced by the protection member 4. That is, in the high frequency module 100n according to the seventh embodiment, the acoustic wave filter 1 can be protected by the protection member 4, and this allows printing on the module surface to be performed easily.

Furthermore, in the high frequency module 100n according to the seventh embodiment, the materials of the protection member 4 include copper, and the protection member 4 is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

In the high frequency module 100n according to the seventh embodiment, the first main surface 41 of the protection member 4 and the main surface 51 of the resin layer 5 are substantially on the same plane. However, the first main surface 41 of the protection member 4 may protrude relative to the main surface 51 of the resin layer 5 in the direction away from the mounting substrate 9.

Eighth Embodiment

Figure 17:
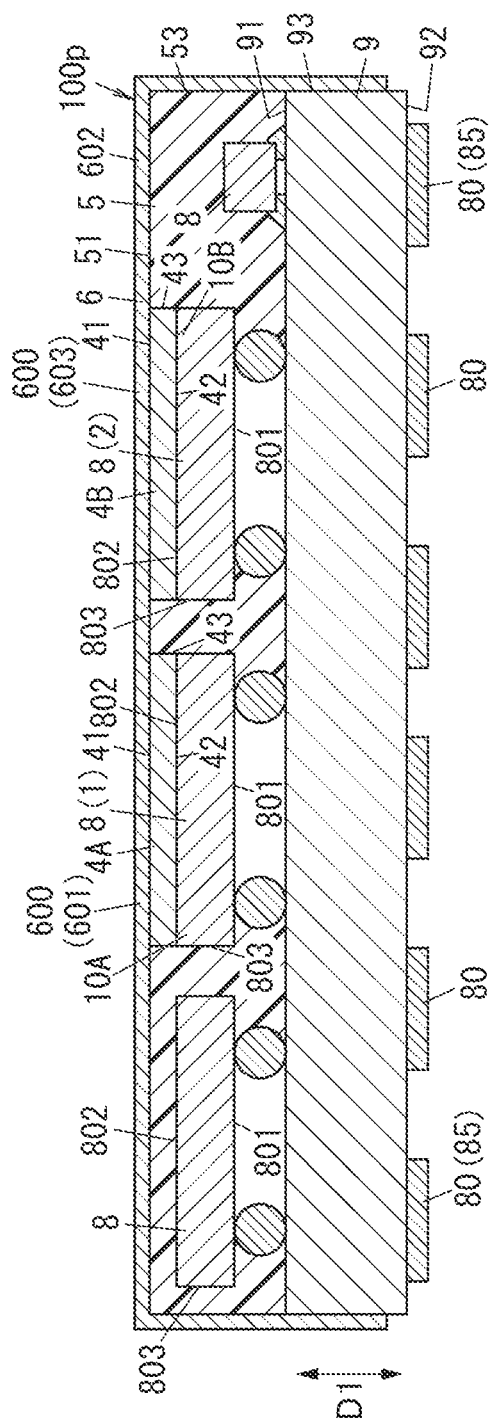
FIG. 17 is a cross-section view of a high frequency module according to an eighth embodiment.

A high frequency module 100p according to an eighth embodiment will be described with reference to FIGS. 17 and 18. Component elements of the high frequency module 100p according to the eighth embodiment similar to those of the high frequency module 100 according to the first embodiment will be denoted by the same signs and description for those component elements will be omitted. The circuit configuration of the high frequency module 100p is similar to the circuit configuration of the high frequency module 100 according to the first embodiment described above with reference to FIG. 1.

In the high frequency module 100p according to the eighth embodiment, the first electronic component 1 and the second electronic component 2 are acoustic wave filters (hereinafter, may also be referred to as "acoustic wave filters 1 and 2"). Furthermore, in the high frequency module 100p according to the eighth embodiment, the acoustic wave filters 1 and 2 are surface acoustic wave filters. In the high frequency module 100p according to the eighth embodiment, the acoustic wave filter 1 is the transmission filter 112A provided on the signal path T1 (see FIG. 1) for transmission signals. Furthermore, in the high frequency module 100p according to the eighth embodiment, the acoustic wave filter 2 is the reception filter 122A provided on the signal path R1 (see FIG. 1) for reception signals.

The acoustic wave filter 1 includes, for example, a substrate 10A and a circuit unit formed on the substrate 10A. The acoustic wave filter 2 includes, for example, a substrate 10B and a circuit unit formed on the substrate 10B. The substrate 10A is, for example, a lithium tantalate substrate. The substrate 10B is, for example, a lithium niobate substrate. That is, in the high frequency module 100p according to the eighth embodiment, the substrate 10A of the acoustic wave filter 1 and the substrate 10B of the acoustic wave filter 2 are made of different materials. The circuit unit includes a plurality of IDT electrodes that are associated with a plurality of series-arm resonators in a one-to-one relationship and a plurality of IDT electrodes that are associated with a plurality of parallel-arm resonators in a one-to-one relationship. Each of the acoustic wave filters 1 and 2 is flip-chip mounted on the first main surface 91 of the mounting substrate 9.

The high frequency module 100p according to the eighth embodiment includes a first protection member 4A and a second protection member 4B. The first protection member 4A is disposed between the acoustic wave filter 1 and the shield layer 6 in the thickness direction D1 of the mounting substrate 9 and is in contact with both the acoustic wave filter 1 and the shield layer 6. The second protection member 4B is disposed between the acoustic wave filter 2 and the shield layer 6 in the thickness direction D1 of the mounting substrate 9 and is in contact with both the acoustic wave filter 2 and the shield layer 6. The first protection member 4A and the second protection member 4B are made of the same materials, and the materials include, for example, copper. That is, each of the first protection member 4A and the second protection member 4B is made of, for example, copper or a copper alloy. The expression "being made of the same materials" herein represents being made of at least the same main component. Furthermore, the term "main component" herein represents a main component in a certain substance. For example, it is desirable that a main component make up 40% or more of a certain substance and it is more desirable that a main component make up 50% or more of a certain substance. Thus, in the high frequency module 100p according to the eighth embodiment, a main component of each of the first protection member 4A and the second protection member 4B is copper. As long as the main component of the first protection member 4A and the main component of the second protection member 4B are the same, other components of the first protection member 4A and the second protection member 4B may be different. That is, the materials of the first protection member 4A and the materials of the second protection member 4B are not necessarily completely the same. In the high frequency module 100p according to the eighth embodiment, the acoustic wave filter 1 is a first acoustic wave filter and the acoustic wave filter 2 is a second acoustic wave filter.

In the case where neither the first protection member 4A nor the second protection member 4B is provided, a top surface (a main surface near the protection member 4) of the substrate 10A configuring the acoustic wave filter 1 and a top surface (a main surface near the protection member 4) of the substrate 10B configuring the acoustic wave filter 2 will be ground. In this case, as described above, because the materials of the substrate 10A configuring the acoustic wave filter 1 and the materials of the substrate 10B configuring the acoustic wave filter 2 are different, the heights (thicknesses) of the two substrates 10A and 10B may differ from each other.

In contrast, in the high frequency module 100p according to the eighth embodiment, the first protection member 4A and the second protection member 4B are provided, and the top surface (first main surface 41) of the first protection member 4A and the top surface (first main surface 41) of the second protection member 4B will be ground. In the high frequency module 100p according to the eighth embodiment, as described above, because the materials of the first protection member 4A and the materials of the second protection member 4B are the same, grinding can be performed in such a manner that the height (thickness) of the first protection member 4A and the height (thickness) of the second protection member 4B are the same.

In the high frequency module 100p according to the eighth embodiment, as described above, the first protection member 4A is disposed between the acoustic wave filter 1 and the shield layer 6, and the second protection member 4B is disposed between the acoustic wave filter 2 and the shield layer 6. Thus, for example, the influence on the acoustic wave filters 1 and 2 in printing on the module surface (shield layer 6) can be reduced by the first protection member 4A and the second protection member 4B. That is, in the high frequency module 100p according to the eighth embodiment, the acoustic wave filters 1 and 2 can be protected by the first protection member 4A and the second protection member 4B, and this allows printing on the module surface to be performed easily. In the high frequency module 100p according to the eighth embodiment, the acoustic wave filter (second electronic component) 2 is an electronic component.

Furthermore, in the high frequency module 100p according to the eighth embodiment, the materials of the first protection member 4A include copper, and the first protection member 4A is in contact with both the acoustic wave filter 1 and the shield layer 6. Thus, the heat generated at the acoustic wave filter 1 can be transferred to the shield layer 6 through the first protection member 4A. As a result, the heat dissipation characteristics of the acoustic wave filter 1 can be improved. Furthermore, in the high frequency module 100p according to the eighth embodiment, the materials of the second protection member 4B include copper, and the second protection member 4B is in contact with both the acoustic wave filter 2 and the shield layer 6. Thus, the heat generated at the acoustic wave filter 2 can be transferred to the shield layer 6 through the second protection member 4B. As a result, the heat dissipation characteristics of the acoustic wave filter 2 can be improved.

Furthermore, in the high frequency module 100p according to the eighth embodiment, the substrate 10A configuring the acoustic wave filter 1 is a lithium tantalate substrate, and the substrate 10B configuring the acoustic wave filter 2 is a lithium niobate substrate. Thus, by making the main surfaces of the substrates 10A and 10B configuring the acoustic wave filters 1 and 2 that are far from the mounting substrate 9 contact with the shield layer 6 with the first protection member 4A and the second protection member 4B interposed therebetween, the temperature characteristics of the acoustic wave filters 1 and 2 can be improved.

Figure 18:
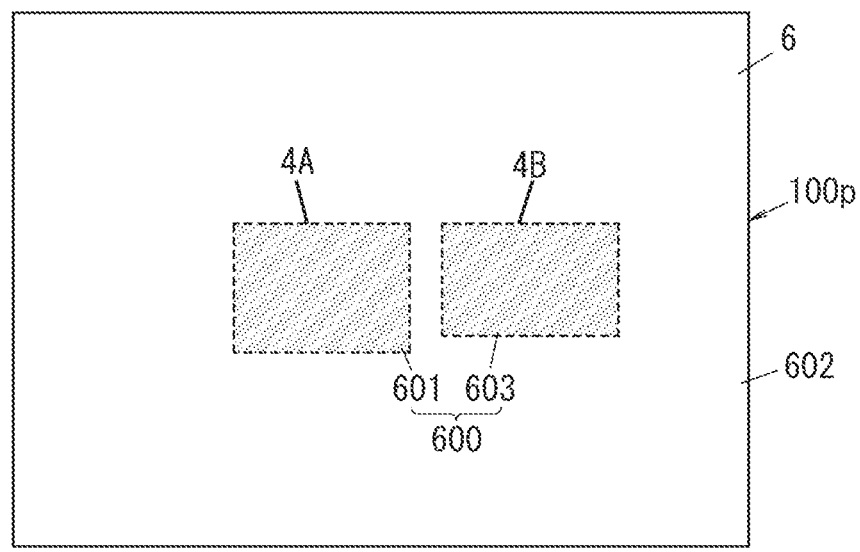
FIG. 18 is a plan view of the high frequency module.

Furthermore, in the high frequency module 100p according to the eighth embodiment, the shield layer 6 includes the first part 601, the second part 602, and a third part 603, as illustrated in FIG. 18. The first part 601 is a part that overlaps with the first protection member 4A in the thickness direction D1 of the mounting substrate 9. The third part 603 is a part that overlaps with the second protection member 4B in the thickness direction D1 of the mounting substrate 9. The second part 602 is a part that overlaps with neither the first protection member 4A nor the second protection member 4B in the thickness direction D1 of the mounting substrate 9. In the high frequency module 100p according to the eighth embodiment, the first protection member 4A, which is made of metal, is provided between the acoustic wave filter 1 and the shield layer 6 in the thickness direction D1 of the mounting substrate 9. Furthermore, in the high frequency module 100p according to the eighth embodiment, the second protection member 4B, which is made of metal, is provided between the acoustic wave filter 2 and the shield layer 6 in the thickness direction D1 of the mounting substrate 9. Thus, for example, the influence on the acoustic wave filters 1 and 2 in printing on the shield layer 6 using a laser marker can be reduced by the first protection member 4A and the second protection member 4B. As a result, the degradation of the acoustic wave filters 1 and 2 caused by laser printing can be reduced. In FIG. 18, a plan view of the high frequency module 100p is illustrated. For easier understanding of the distinction of the first part 601 and the third part 603 from the second part 602, the first part 601 and the third part 603 are hatched with the dots.

In the high frequency module 100p according to the eighth embodiment, the substrate 10A configuring the acoustic wave filter 1 is a lithium tantalate substrate, and the substrate 10B configuring the acoustic wave filter 2 is a lithium niobate substrate. However, the substrate 10A is not necessarily a lithium tantalate substrate, and the substrate 10B is not necessarily a lithium niobate substrate. For example, both the substrates 10A and 10B configuring the acoustic wave filters 1 and 2 may be lithium tantalate substrates or may be lithium niobate substrates. That is, the substrates 10A and 10B configuring the acoustic wave filters 1 and 2 may be made of the same materials. Also in this case, since the materials of the first protection member 4A and the materials of the second protection member 4B are the same, grinding can be performed in such a manner that the height (thickness) of the first protection member 4A and the height (thickness) of the second protection member 4B are the same.

In the high frequency module 100p according to the eighth embodiment, the acoustic wave filter 1 is the transmission filter 112A and the acoustic wave filter 2 is the reception filter 122A. However, the acoustic wave filter 1 is not necessarily the transmission filter 112A and the acoustic wave filter 2 is not necessarily the reception filter 122A. For example, the acoustic wave filter 1 may be the transmission filter 112A and the acoustic wave filter 2 may be the transmission filter 112B. Alternatively, the acoustic wave filter 1 may be the reception filter 122A and the acoustic wave filter 2 may be the reception filter 122B.

In the high frequency module 100p according to the eighth embodiment, the first main surface 41 of the first protection member 4A and the main surface 51 of the resin layer 5 are substantially on the same plane. However, the first main surface 41 of the first protection member 4A may protrude relative to the main surface 51 of the resin layer 5 in the direction away from the mounting substrate 9. Furthermore, in the high frequency module 100p according to the eighth embodiment, the first main surface 41 of the second protection member 4B and the main surface 51 of the resin layer 5 are substantially on the same plane. However, the first main surface 41 of the second protection member 4B may protrude relative to the main surface 51 of the resin layer 5 in the direction away from the mounting substrate 9.

Ninth Embodiment

Figure 19:
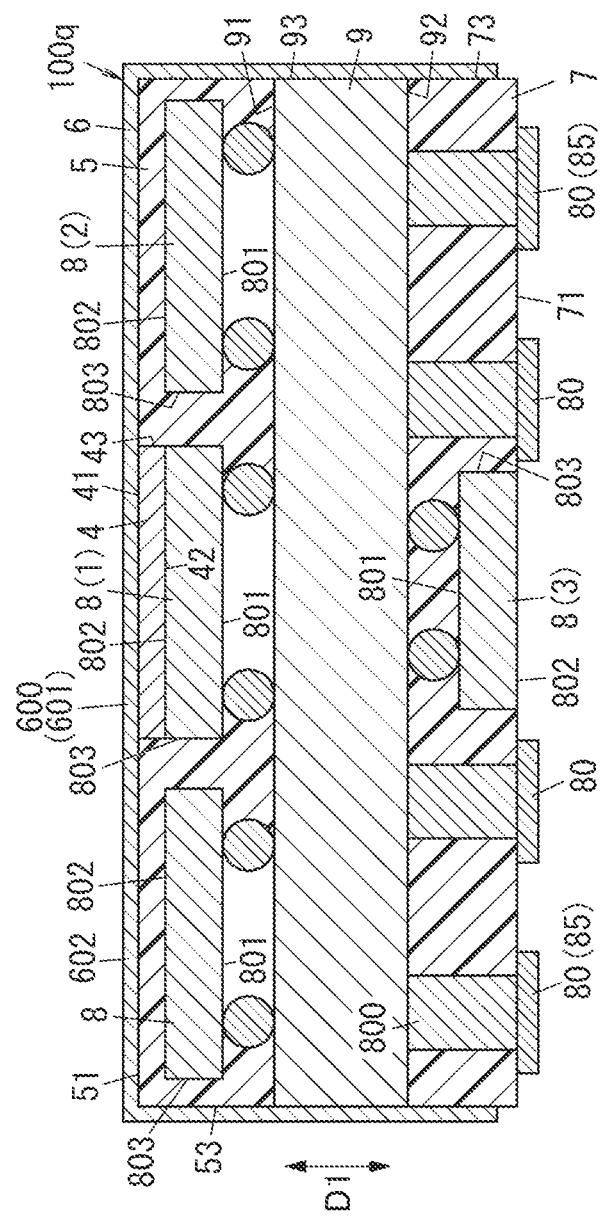
FIG. 19 is a cross-section view of a high frequency module according to a ninth embodiment.

A high frequency module 100q according to a ninth embodiment will be described with reference to FIG. 19. Component elements of the high frequency module 100q according to the ninth embodiment similar to those of the high frequency module 100 according to the first embodiment will be denoted by the same signs and description for those component elements will be omitted. The circuit configuration of the high frequency module 100q is similar to the circuit configuration of the high frequency module 100 according to the first embodiment described above with reference to FIG. 1.

In the high frequency module 100q according to the ninth embodiment, the plurality of electronic components 8 include the first electronic component 1, the second electronic component 2, and a third electronic component 3. The first electronic component 1 and the second electronic component 2 are mounted on the first main surface 91 of the mounting substrate 9. The third electronic component 3 is mounted on the second main surface 92 of the mounting substrate 9. That is, the plurality of electronic components 8 are mounted on both the first main surface 91 and the second main surface 92 of the mounting substrate 9. Thus, compared to the high frequency module 100 according to the first embodiment, the size of the high frequency module 100q according to the ninth embodiment when viewed from the thickness direction D1 of the mounting substrate 9 can be made small. In the high frequency module 100q according to the ninth embodiment, the third electronic component 3 is a circuit element.

Furthermore, in the high frequency module 100q according to the ninth embodiment, each of the plurality of external connection terminals 80 includes a columnar electrode 800. Each of the columnar electrodes 800 is, for example, an electrode of a column shape.

The high frequency module 100q according to the ninth embodiment further includes a resin layer 7. The resin layer 7 covers the outer peripheral surface 803 of the third electronic component 3 disposed on the second main surface 92 of the mounting substrate 9 and an outer peripheral surface of each of the columnar electrodes 800.

The resin layer 7 is formed in such a manner that the second main surface 802 of the electronic component 8 configuring the third electronic component 3 is exposed. The resin layer 7 includes resin (for example, epoxy resin). The resin layer 7 may include a filler as well as resin. The resin layer 7 may be made of the same material as that of the resin layer 5 or may be made of a material different from that of the resin layer 5. In the high frequency module 100q according to the ninth embodiment, the shield layer 6 also covers an outer peripheral surface 73 of the resin layer 7.

Furthermore, in the high frequency module 100q according to the ninth embodiment, the second main surface 802 of the electronic component 8 configuring the third electronic component 3 and a main surface 71 of the resin layer 7 that is far from the mounting substrate 9 are substantially on the same plane.

In the high frequency module 100q according to the ninth embodiment, the protection member 4 is disposed between the first electronic component (acoustic wave filter) 1 and the shield layer 6 in the thickness direction D1 of the mounting substrate 9, as in the high frequency module 100 according to the first embodiment. Thus, for example, the influence on the acoustic wave filter 1 in printing on the module surface (shield layer 6) can be reduced by the protection member 4. That is, in the high frequency module 100q according to the ninth embodiment, the acoustic wave filter 1 can be protected by the protection member 4, and this allows printing on the module surface to be performed easily.

Furthermore, in the high frequency module 100q according to the ninth embodiment, the protection member 4 is made of copper and is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

Furthermore, in the high frequency module 100q according to the ninth embodiment, the resin layer 7 is formed in such a manner that the second main surface 802 of the third electronic component 3 is exposed. Thus, an increase of the temperature of the third electronic component 3 can also be reduced. Furthermore, with the arrangement in which the electronic component 8 is also disposed on the second main surface 92 of the mounting substrate 9, the height of the high frequency module 100q according to the ninth embodiment can be reduced compared to the case where the second main surface 802 of the third electronic component 3 is not exposed.

In the high frequency module 100q according to the ninth embodiment, the first main surface 41 of the protection member 4 and the main surface 51 of the resin layer 5 are substantially on the same plane. However, the first main surface 41 of the protection member 4 may protrude relative to the main surface 51 of the resin layer 5 in the direction away from the mounting substrate 9.

Tenth Embodiment

Figure 20:
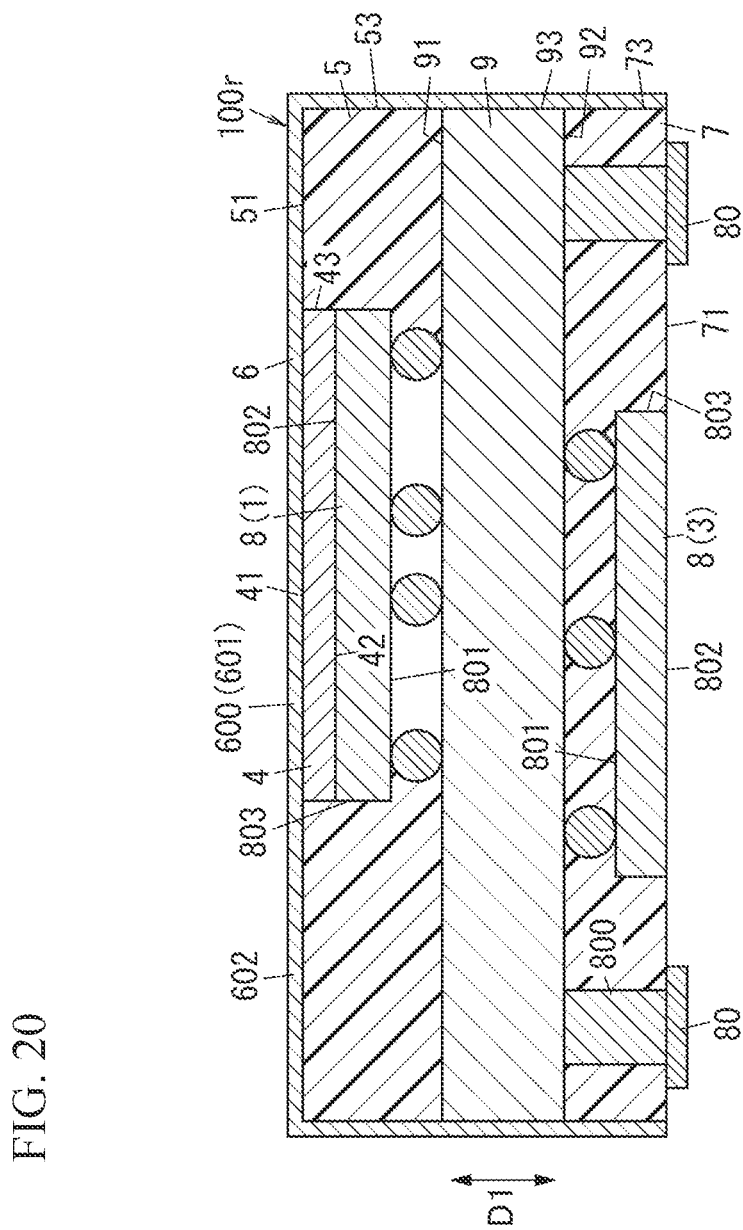
FIG. 20 is a cross-section view of a high frequency module according to a tenth embodiment.

A high frequency module 100r according to a tenth embodiment will be described with reference to FIGS. 20 and 21. Component elements of the high frequency module 100r according to the tenth embodiment similar to those of the high frequency module 100n according to the seventh embodiment will be denoted by the same signs and description for those component elements will be omitted. The circuit configuration of the high frequency module 100r is similar to the circuit configuration of the high frequency module 100 according to the first embodiment described above with reference to FIG. 1.

In the high frequency module 100r according to the tenth embodiment, the plurality of electronic components 8 include the first electronic component 1 and the third electronic component 3. The first electronic component 1 is, for example, a single-chip electronic component including the transmission filter 112A (see FIG. 1) and the reception filter 122A (see FIG. 1). The third electronic component 3 is, for example, an IC chip including the low noise amplifier 121 (see FIG. 1). Furthermore, in the high frequency module 100r according to the tenth embodiment, the mounting substrate 9 includes an inner-layer inductor 94 (see FIG. 21). The inner-layer inductor 94 is, for example, an inductor between the reception filter 122A and the selection terminal 161 of the third switch 106. In the high frequency module 100r according to the tenth embodiment, the third electronic component 3 is a circuit element.

Figure 21:
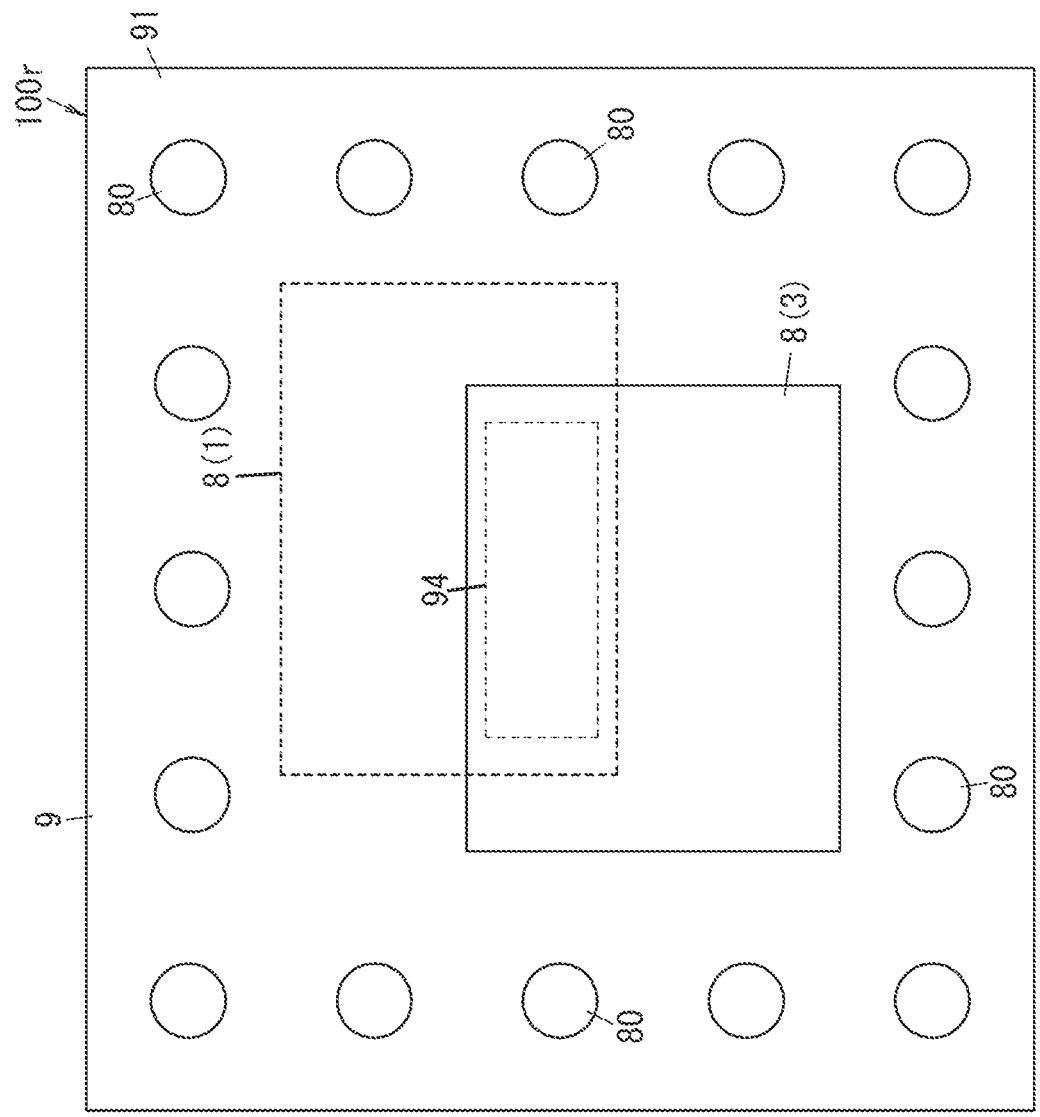
FIG. 21 is a plan view of the high frequency module.

In the high frequency module 100r according to the tenth embodiment, as illustrated in FIG. 21, part of the first electronic component 1, part of the third electronic component 3, and the inner-layer inductor 94 overlap with one another in the thickness direction D1 of the mounting substrate 9. Thus, the stray capacitance generated between the inner-layer inductor 94 and the ground layer can be reduced, and the power loss can thus be reduced.

In the high frequency module 100r according to the tenth embodiment, the protection member 4 is disposed between the acoustic wave filter 1 and the shield layer 6 in the thickness direction D1 of the mounting substrate 9, as in the high frequency module 100n according to the seventh embodiment. Thus, for example, the influence on the acoustic wave filter 1 in printing on the module surface (shield layer 6) can be reduced by the protection member 4. That is, in the high frequency module 100r according to the tenth embodiment, the acoustic wave filter 1 can be protected by the protection member 4, and this allows printing on the module surface to be performed easily.

Furthermore, in the high frequency module 100r according to the tenth embodiment, the protection member 4 is made of copper and is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

In the high frequency module 100r according to the tenth embodiment, the entire second main surface 802 of the third electronic component 3 are exposed. However, only part of the second main surface 802 may be exposed.

Furthermore, in the high frequency module 100r according to the tenth embodiment, the first main surface 41 of the protection member 4 and the main surface 51 of the resin layer 5 are substantially on the same plane. However, the first main surface 41 of the protection member 4 may protrude relative to the main surface 51 of the resin layer 5 in the direction away from the mounting substrate 9.

Furthermore, in the high frequency module 100r according to the tenth embodiment, part of the first electronic component 1, part of the third electronic component 3, and the entire inner-layer inductor 94 overlap with one another. However, part of the first electronic component 1, part of the third electronic component 3, and the entire inner-layer inductor 94 do not necessarily overlap with one another. For example, the entire first electronic component 1, part of the third electronic component 3, and the entire inner-layer inductor 94 may overlap with one another or part of the first electronic component 1, the entire third electronic component 3, and the entire inner-layer inductor 94 may overlap with one another. Alternatively, the entire first electronic component 1, the entire third electronic component 3, and the entire inner-layer inductor 94 may overlap with one another. In short, the expression "the first electronic component 1, the third electronic component 3, and the inner-layer inductor 94 overlap with one another when viewed in plan from the thickness direction D1 of the mounting substrate 9" represents a state in which at least part of the first electronic component 1, at least part of the third electronic component 3, and the entire inner-layer inductor 94 overlap with one another when viewed in plan from the thickness direction D1 of the mounting substrate 9.

Modification of Tenth Embodiment

Figure 22:
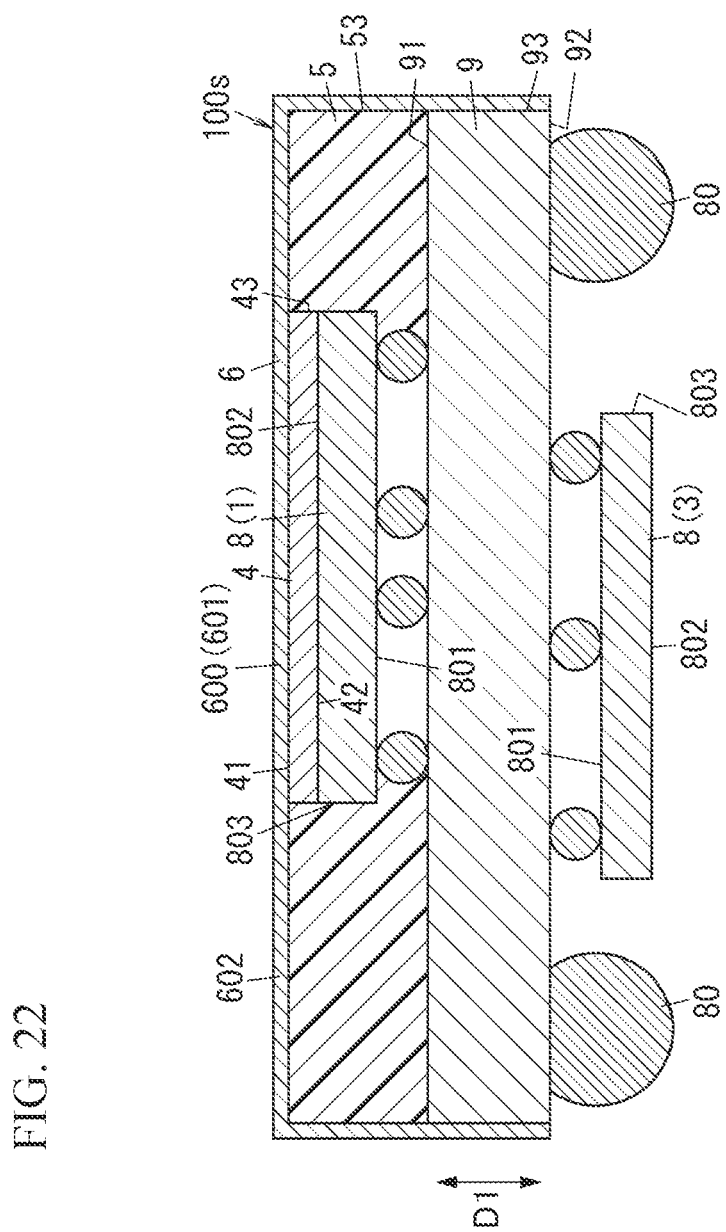
FIG. 22 is a cross-section view of a high frequency module according to a modification of the tenth embodiment.

A high frequency module 100s according to a modification of the tenth embodiment will be described with reference to FIG. 22. Component elements of the high frequency module 100s according to the modification of the tenth embodiment similar to those of the high frequency module 100r according to the tenth embodiment will be denoted by the same signs and description for those component elements will be omitted.

The high frequency module 100s according to the modification of the tenth embodiment is different from the high frequency module 100r according to the tenth embodiment in that the plurality of external connection terminals 80 are ball bumps. Furthermore, the high frequency module 100s according to the modification of the tenth embodiment is different from the high frequency module 100r according to the tenth embodiment in that the high frequency module 100s does not include the resin layer 7 of the high frequency module 100r according to the tenth embodiment.

A ball bump configuring each of the plurality of external connection terminals 80 is made of, for example, gold, copper, or solder.

Some of the plurality of external connection terminals 80 may be ball bumps, and other external connection terminals 80 may be columnar electrodes.

In the high frequency module 100s according to the modification of the tenth embodiment, the protection member 4 is disposed between the acoustic wave filter 1 and the shield layer 6 in the thickness direction D1 of the mounting substrate 9 as in the high frequency module 100r according to the tenth embodiment. Thus, for example, the influence on the acoustic wave filter 1 in printing on the module surface (shield layer 6) can be reduced by the protection member 4. That is, in the high frequency module 100s according to the modification of the tenth embodiment, the acoustic wave filter 1 can be protected by the protection member 4, and this allows printing on the module surface to be performed easily. In the high frequency module 100s according to the modification of the tenth embodiment, the third electronic component 3 is a circuit element.

Furthermore, in the high frequency module 100s according to the modification of the tenth embodiment, the protection member 4 is made of copper and is in contact with both the acoustic wave filter 1 and the shield layer 6. Thus, the heat generated at the acoustic wave filter 1 can be transferred to the shield layer 6 through the protection member 4. As a result, the heat dissipation characteristics of the acoustic wave filter 1 can be improved.

Eleventh Embodiment

Figure 23:
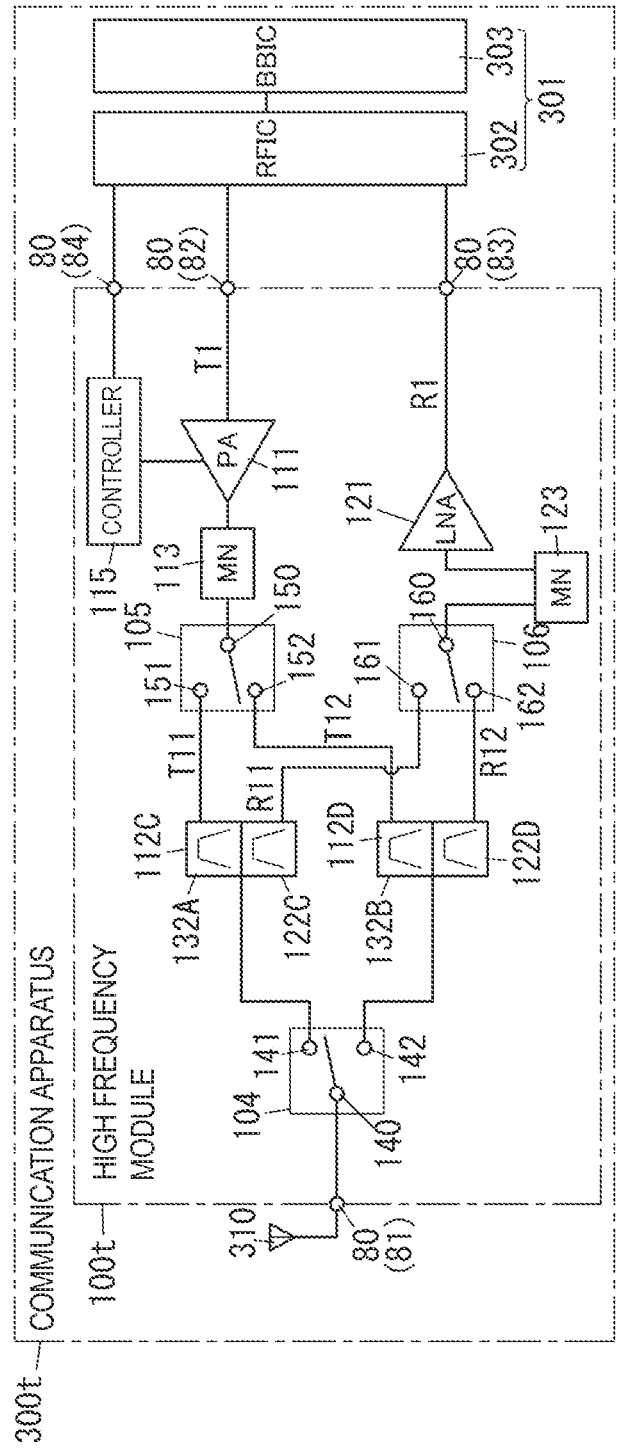
FIG. 23 is a circuit configuration diagram of a communication apparatus including a high frequency module according to an eleventh embodiment.
Figure 24:
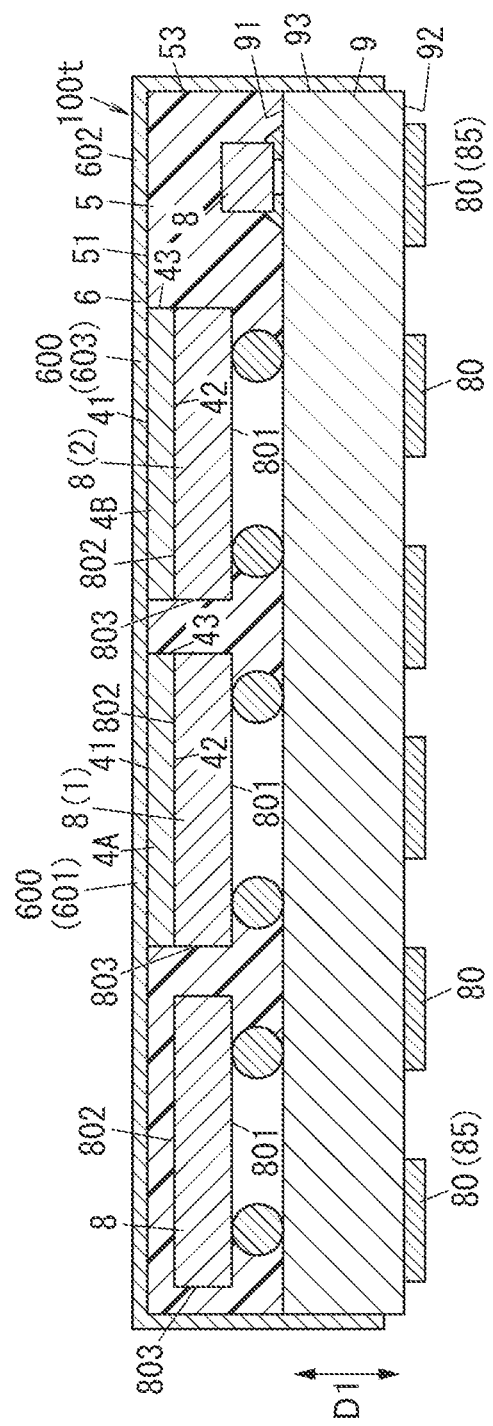
FIG. 24 is a cross-section view of the high frequency module.

A high frequency module 100t and a communication apparatus 300t according to an eleventh embodiment will be described with reference to FIGS. 23 and 24. Component elements of the high frequency module 100t and the communication apparatus 300t according to the eleventh embodiment similar to those of the high frequency module 100 and the communication apparatus 300 according to the first embodiment will be denoted by the same signs and description for those component elements will be omitted.

The high frequency module 100t according to the eleventh embodiment is different from the high frequency module 100 according to the first embodiment in that a transmission filter 112C and a reception filter 122C are a transmission filter and a reception filter that configure a duplexer 132A and a transmission filter 112D and a reception filter 122D are a transmission filter and a reception filter that configure a duplexer 132B.

The communication apparatus 300t according to the eleventh embodiment includes the high frequency module 100t, in place of the high frequency module 100 described above. Furthermore, the communication apparatus 300t according to the eleventh embodiment further includes the signal processing circuit 301 and the antenna 310.

In the high frequency module 100t according to the eleventh embodiment, the first electronic component 1 and the second electronic component 2 are acoustic wave filters (hereinafter, may also be referred to as "acoustic wave filters 1 and 2"). The acoustic wave filter 1 is, for example, the transmission filter 112C provided on the signal path T1 (see FIG. 23) for transmission signals. The acoustic wave filter 2 is, for example, the reception filter 122C provided on the signal path R1 (see FIG. 23) for reception signals. That is, the first electronic component (acoustic wave filter) 1 is the transmission filter 112C of the duplexer 132A, in which the distance between the transmission band and the reception band is shortest, among the duplexers 132A and 132B. Furthermore, the second electronic component 2 is the reception filter 122C of the duplexer 132A, in which the distance between the transmission band and the reception band is shortest, among the duplexers 132A and 132B. In the high frequency module 100t according to the eleventh embodiment, the second electronic component 2 configuring the acoustic wave filter 2 is an electronic component.

Each of the first electronic component 1 and the second electronic component 2 includes, for example, a substrate and a circuit unit formed on the substrate. The substrate is a piezoelectric substrate. The piezoelectric substrate is, for example, a lithium niobate substrate. The circuit unit includes a plurality of IDT electrodes that are associated with a plurality of series-arm resonators in a one-to-one relationship and a plurality of IDT electrodes that are associated with a plurality of parallel-arm resonators in a one-to-one relationship. Each of the first electronic component 1 and the second electronic component 2 is flip-chip mounted on the first main surface 91 of the mounting substrate 9.

The high frequency module 100t according to the eleventh embodiment includes the first protection member 4A and the second protection member 4B. The first protection member 4A is disposed between the acoustic wave filter 1 and the shield layer 6 in the thickness direction D1 of the mounting substrate 9 and is in contact with both the acoustic wave filter 1 and the shield layer 6. The second protection member 4B is disposed between the acoustic wave filter 2 and the shield layer 6 in the thickness direction D1 of the mounting substrate 9 and is in contact with both the acoustic wave filter 2 and the shield layer 6.

In the high frequency module 100t according to the eleventh embodiment, as described above, the first protection member 4A is disposed between the acoustic wave filter 1 and the shield layer 6, and the second protection member 4B is disposed between the acoustic wave filter 2 and the shield layer 6. Thus, for example, the influence on the acoustic wave filters 1 and 2 in printing on the module surface (shield layer 6) can be reduced by the first protection member 4A and the second protection member 4B. That is, in the high frequency module 100t according to the eleventh embodiment, the acoustic wave filters 1 and 2 can be protected by the first protection member 4A and the second protection member 4B, and this allows printing on the module surface to be performed easily.

Furthermore, in the high frequency module 100t according to the eleventh embodiment, the materials of the first protection member 4A and the second protection member 4B include copper. Thus, the heat generated at the acoustic wave filters 1 and 2 can be transferred to the shield layer 6 through the first protection member 4A and the second protection member 4B. Therefore, the heat propagated from the first acoustic wave filter 1 to the second acoustic wave filter 2 can also be transferred to the shield layer 6 through the second protection member 4B, and the degradation of the characteristics of the reception filter 122C as the acoustic wave filter 2 can be reduced. Furthermore, the temperature characteristics of the acoustic wave filters 1 and 2 can also be improved. Thus, the degradation of characteristics such as the isolation between the transmission filter 112C as the acoustic wave filter 1 and the reception filter 122C as the acoustic wave filter 2 can also be reduced.

In the high frequency module 100t according to the eleventh embodiment, the piezoelectric substrate configuring each of the first electronic component 1 and the second electronic component 2 is a lithium niobate substrate. However, at least one of the piezoelectric substrate configuring the first electronic component 1 and the piezoelectric substrate configuring the second electronic component 2 may be, for example, a lithium tantalate substrate or a crystal substrate. Furthermore, the materials of the piezoelectric substrate configuring the first electronic component 1 and the materials of the piezoelectric substrate configuring the second electronic component 2 may be different from each other. For example, the piezoelectric substrate configuring the first electronic component 1 may be a lithium tantalate substrate and the piezoelectric substrate configuring the second electronic component 2 may be a lithium niobate substrate.

Furthermore, in the high frequency module 100t according to the eleventh embodiment, the materials of the first protection member 4A and the materials of the second protection member 4B are the same. However, the materials of the first protection member 4A and the materials of the second protection member 4B may be different from each other.

Twelfth Embodiment

Figure 25:
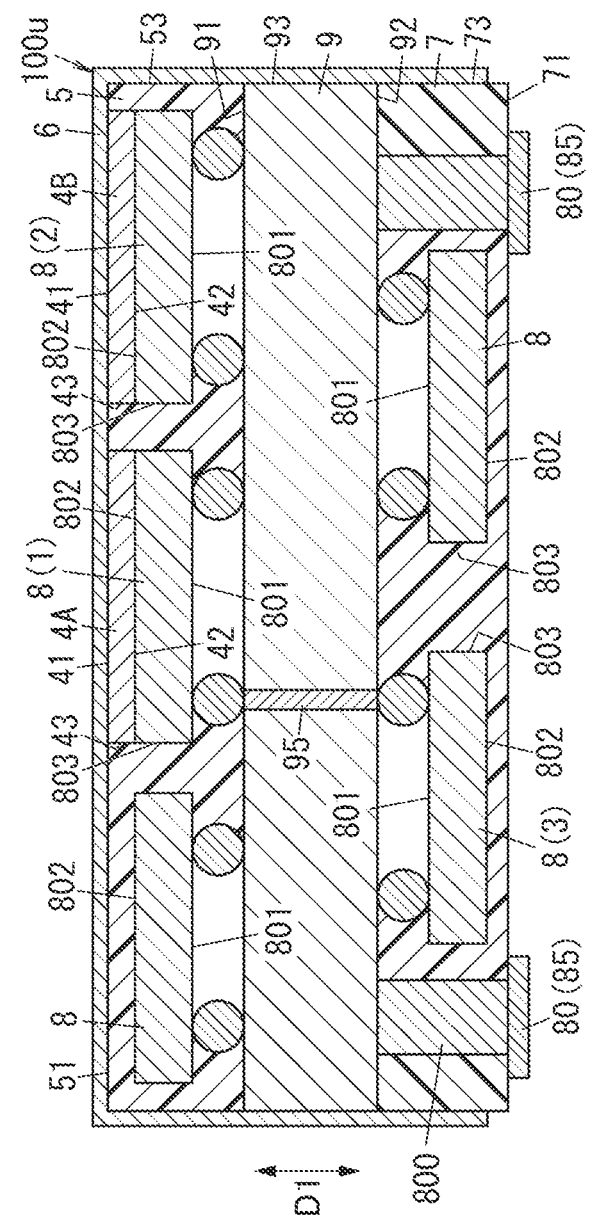
FIG. 25 is a cross-section view of a high frequency module according to a twelfth embodiment.

A high frequency module 100u according to a twelfth embodiment will be described with reference to FIG. 25. Component elements of the high frequency module 100u according to the twelfth embodiment similar to those of the high frequency module 100*t* according to the eleventh embodiment will be denoted by the same signs and description for those component elements will be omitted. The circuit configuration of the high frequency module 100*u* is similar to the circuit configuration of the high frequency module 100*t* according to the eleventh embodiment described above with reference to FIG. 23.

In the high frequency module 100*u* according to the twelfth embodiment, the plurality of electronic components 8 include the first electronic component 1, the second electronic component 2, and the third electronic component 3. The first electronic component 1, the second electronic component 2, and the third electronic component 3 are acoustic wave filters (hereinafter, may also be referred to as "acoustic wave filters 1, 2, and 3"). The acoustic wave filter 1 is, for example, the transmission filter 112C provided on the signal path T1 (see FIG. 23) for transmission signals. The acoustic wave filter 3 is, for example, the reception filter 122C provided on the signal path R1 (see FIG. 23) for reception signals. That is, the first electronic component 1 is the transmission filter 112C of the duplexer 132A, in which the distance between the transmission band and the reception band is shortest, among the duplexers 132A and 132B. The third electronic component 3 is the reception filter 122C of the duplexer 132A, in which the distance between the transmission band and the reception band is shortest, among the duplexers 132A and 132B. Furthermore, the acoustic wave filter 2 is, for example, the transmission filter 112D provided on the signal path T1 (see FIG. 23) for transmission signals.

Each of the first electronic component 1, the second electronic component 2, and the third electronic component 3 includes, for example, a substrate and a circuit unit formed on the substrate. The substrate is a piezoelectric substrate. The piezoelectric substrate of each of the first electronic component 1 and the second electronic component 2 is, for example, a lithium tantalate substrate. The piezoelectric substrate of the third electronic component 3 is, for example, a lithium niobate substrate. The circuit unit includes a plurality of IDT electrodes that are associated with a plurality of series-arm resonators in a one-to-one relationship and a plurality of IDT electrodes that are associated with a plurality of parallel-arm resonators in a one-to-one relationship.

Each of the first electronic component 1 and the second electronic component 2 is flip-chip mounted on the first main surface 91 of the mounting substrate 9. The third electronic component 3 is flip-chip mounted on the second main surface 92 of the mounting substrate 9. That is, the first electronic component 1 and the second electronic component 2 are mounted on the first main surface 91 of the mounting substrate 9, and the third electronic component 3 is mounted on the second main surface 92 of the mounting substrate 9. In the high frequency module 100*u* according to the twelfth embodiment, the plurality of electronic components 8 are mounted on both the first main surface 91 and the second main surface 92 of the mounting substrate 9. In the high frequency module 100*u* according to the twelfth embodiment, the third electronic component 3 is a circuit element.

Furthermore, in the high frequency module 100*u* according to the twelfth embodiment, a through electrode 95 that penetrates through the mounting substrate 9 in the thickness direction D1 of the mounting substrate 9 allows the connection between the first electronic component 1 positioned on the first main surface 91 of the mounting substrate 9 and the third electronic component 3 positioned on the second main surface 92 of the mounting substrate 9. The through electrode 95 is, for example, a TSV (through silicon via). An electrical insulating part is interposed between the through electrode 95 and the mounting substrate 9. The electrical insulating part is made of, for example, silicon oxide. The through electrode 95 has, for example, a column shape.

In the high frequency module 100*u* according to the twelfth embodiment, part of the first electronic component 1, part of the third electronic component 3, and the through electrode 95 overlap with one another when viewed in plan from the thickness direction D1 of the mounting substrate 9.

Furthermore, in the high frequency module 100*u* according to the twelfth embodiment, in the thickness direction D1 of the mounting substrate 9, the first protection member 4A is disposed between the first electronic component 1 and the shield layer 6, and the second protection member 4B is disposed between the second electronic component 2 and the shield layer 6. Thus, for example, the influence on the first electronic component 1 and the second electronic component 2 in printing on the module surface (shield layer 6) can be reduced by the first protection member 4A and the second protection member 4B. That is, in the high frequency module 100*u* according to the twelfth embodiment, the first electronic component 1 and the second electronic component 2 can be protected by the first protection member 4A and the second protection member 4B, and this allow printing on the module surface to be performed easily.

Furthermore, in the high frequency module 100*u* according to the twelfth embodiment, the materials of the first protection member 4A and the second protection member 4B include copper. Thus, the heat generated at the first electronic component 1 and the second electronic component 2 can be transferred to the shield layer 6 through the first protection member 4A and the second protection member 4B. Therefore, the temperature characteristics of the duplexer 132A, which includes the transmission filter 112C configured as the first electronic component 1 and the reception filter 122C configured as the third electronic component 3, can be improved.

Furthermore, the transmission filter 112C and the reception filter 122C that configure the duplexer 132A are mounted on the first main surface 91 and the second main surface 92, respectively, of the mounting substrate 9, and the transmission filter 112C and the reception filter 122C are arranged to overlap with each other in the thickness direction D1 of the mounting substrate 9. Thus, the length of a connection part (through electrode 95) between the transmission filter 112C and the reception filter 122C is shortened. As a result, a parasitic component can be reduced.

OTHER MODIFICATIONS

The first to twelfth embodiments and the like described above are merely embodiments of the present disclosure. Various changes may be made to the first to twelfth embodiments and the like in accordance with designs and the like as long as a possible benefit of the present disclosure can be attained.

Although a BAW filter configuring the first electronic component 1 described above includes an element of a package structure, the BAW filter does not necessarily include an element of a package structure and may be a bare-chip BAW filter. Furthermore, in the case where the first BAW resonator 180 of the BAW filter is an FBAR, the first BAW resonator 180 does not necessarily have the structure illustrated in FIG. 7. For example, the first BAW resonator 180 may be arranged in such a manner that a cavity is formed between part of the electrical insulating film 185 and the first main surface 11 of the first substrate 10, instead of being arranged in such a manner the cavity 184 is formed in the first substrate 10. In this case, the first electrode 181 may be formed on a side of the electrical insulating film 185 that is far from the cavity, the piezoelectric film 182 may be formed on the first electrode 181, and the second electrode 183 may be formed on the piezoelectric film 182. The cavity between the part of the electrical insulating film 185 and the first main surface 11 of the first substrate 10 may be formed by using, for example, a sacrificial layer etching technique.

Furthermore, filters such as the transmission filters 112A and 112B and the reception filters 122A and 122B are not necessarily ladder filters and may be, for example, longitudinally-coupled-resonator-type surface acoustic wave filters.

Furthermore, although the acoustic wave filters described above are acoustic wave filters using surface acoustic waves or bulk acoustic waves, the acoustic wave filters do not necessarily use surface acoustic waves or bulk acoustic waves and may use, for example, acoustic boundary waves, plate waves, or the like.

Although the plurality of first bumps 101 and 201 and the plurality of second bumps 202 are, for example, solder bumps, these bumps are not necessarily solder bumps and may be, for example, gold bumps.

Out of the plurality of electronic components 8, electronic components 8 other than the first electronic component 1 and the second electronic component 2 are not necessarily electrically connected to the mounting substrate 9 with bumps interposed therebetween and may be, for example, electrically connected to the mounting substrate 9 with bonding wire interposed therebetween.

The circuit configurations of the high frequency modules 100 to 100u are not limited to the examples described above. Furthermore, each of the high frequency modules 100 to 100u may include, as a circuit configuration, for example, a high frequency front end circuit supporting MIMO (Multi Input Multi Output).

Furthermore, the communication apparatus 300 according to the first embodiment may include any one of the high frequency modules 100a to 100s, in place of the high frequency module 100. Furthermore, the communication apparatus 300t according to the eleventh embodiment may include the high frequency module 100u, in place of the high frequency module 100t.

ASPECTS

Aspects described below are disclosed herein.

According to a first aspect, a high frequency module (100; 100a to 100u) includes a mounting substrate (9), an acoustic wave filter (1, 2), a protection member (4; 4A, 4B), a resin layer (5), and a shield layer (6). The mounting substrate (9) has a first main surface (91) and a second main surface (92) that face each other. The acoustic wave filter (1) is mounted on the first main surface (91) of the mounting substrate (9). The protection member (4; 4A, 4B) is disposed on a main surface (second main surface 802) of the acoustic wave filter (1) that is far from the mounting substrate (9). The resin layer (5) is disposed on the first main surface (91) of the mounting substrate (9) and covers an outer peripheral surface (803) of the acoustic wave filter (1, 2) and an outer peripheral surface (43) of the protection member (4; 4A, 4B). The shield layer (6) covers the resin layer (5) and the protection member (4; 4A, 4B). The protection member (4; 4A, 4B) is in contact with both the acoustic wave filter (1, 2) and the shield layer (6). The acoustic wave filter (1, 2) includes a piezoelectric substrate (10). A main surface (12) of the piezoelectric substrate (10) that is far from the mounting substrate (9) is in contact with the protection member (4; 4A, 4B).

According to this aspect, printing on the module surface (shield layer 6) can be performed easily.

Furthermore, according to this aspect, in the case where the protection member (4; 4A, 4B) is a heat transmission member, the heat generated at the acoustic wave filter (1, 2) can be transferred to the shield layer (6) through the protection member (4; 4A, 4B).

According to a second aspect, in the high frequency module (100e) according to the first aspect, the acoustic wave filter (1) includes a piezoelectric layer (194), an IDT electrode (15), and a high acoustic velocity member (first substrate 10 and low acoustic velocity film 193). The IDT electrode (15) is disposed on the piezoelectric layer (194). The high acoustic velocity member is disposed opposite to the IDT electrode (15) with the piezoelectric layer (194) interposed therebetween. An acoustic velocity of a bulk wave propagating in the high acoustic velocity member is higher than an acoustic velocity of an acoustic wave propagating in the piezoelectric layer (194). The high acoustic velocity member includes a supporting substrate (10) that is a silicon substrate. A main surface (12) of the supporting substrate (10) that is far from the mounting substrate (9) is in contact with the protection member (4).

According to this aspect, in the case where the protection member (4) is a heat transmission member, the heat generated at the acoustic wave filter (1) can be transferred to the shield layer (6) through the protection member (4).

According to a third aspect, a high frequency module (100c; 100d) includes a mounting substrate (9), an acoustic wave filter (1), a protection member (4), a resin layer (5), and a shield layer (6). The mounting substrate (9) has a first main surface (91) and a second main surface (92) that face each other. The acoustic wave filter (1) is mounted on the first main surface (91) of the mounting substrate (9). The protection member (4) is disposed on a main surface (second main surface 802) of the acoustic wave filter (1) that is far from the mounting substrate (9). The resin layer (5) is disposed on the first main surface (91) of the mounting substrate (9) and covers an outer peripheral surface (803) of the acoustic wave filter (1) and an outer peripheral surface (43) of the protection member (4). The shield layer (6) covers the resin layer (5) and the protection member (4). The protection member (4) is in contact with both the acoustic wave filter (1) and the shield layer (6). The acoustic wave filter (1) includes a supporting substrate (10) that is a silicon substrate. A main surface (12) of the supporting substrate (10) that is far from the mounting substrate (9) is in contact with the protection member (4).

According to this aspect, in the case where the protection member (4) is a heat transmission member, the heat generated at the acoustic wave filter (1) can be transferred to the shield layer (6) through the protection member (4).

According to a fourth aspect, the high frequency module (100f) according to any one of the first to third aspects further includes an adhesion layer (20). The adhesion layer (20) bonds the protection member (4) to the acoustic wave filter (1).

According to this aspect, the protection member (4) can be fixed firmly to the acoustic wave filter (1).

According to a fifth aspect, in the high frequency module (100h; 100m) according to any one of the first to fourth aspects, a main surface (41) of the protection member (4)

that is far from the mounting substrate (9) protrudes toward the shield layer (6) relative to a main surface (51) of the resin layer (5) that is far from the mounting substrate (9).

According to this aspect, the close contactness between the protection member (4) and the shield layer (6) can be improved.

According to a sixth aspect, in the high frequency module (100*i*) according to any one of the first to fifth aspects, the shield layer (6) includes a first contact part (61) and a second contact part (62). The first contact part (61) is a part that is in contact with a main surface (41) of the protection member (4) that is far from the mounting substrate (9). The second contact part (62) is a part that is in contact with an outer peripheral surface (43) of the protection member (4) along a thickness direction (D1) of the mounting substrate (9).

According to this aspect, the close contactness between the protection member (4) and the shield layer (6) can be improved.

According to a seventh aspect, in the high frequency module (100; 100*a* to 100*u*) according to any one of the first to sixth aspects, the materials of the protection member (4; 4A to 4D) include copper.

According to this aspect, the heat dissipation characteristics of the acoustic wave filter (1) can be improved.

According to an eighth aspect, in the high frequency module (100; 100*a* to 100*u*) according to any one of the first to sixth aspects, the protection member (4; 4A to 4D) is an insulating material.

According to a ninth aspect, in the high frequency module (100; 100*a* to 100*u*) according to any one of the first to eighth aspects, the acoustic wave filter (1) is a transmission filter (112A) provided on a signal path (T1) for a transmission signal.

According to this aspect, the influence on the acoustic wave filter (1) in printing on the shield layer (6) can be reduced.

According to a tenth aspect, the high frequency module (100*k*; 100*m*) according to any one of the first to ninth aspects further includes a high frequency element (2). The high frequency element (2) is mounted on the first main surface (91) of the mounting substrate (9). The acoustic wave filter (1) is disposed on a main surface (802) of the high frequency element (2) that is far from the mounting substrate (9).

According to this aspect, the influence on the acoustic wave filter (1) in printing on the shield layer (6) can be reduced while the area of the first main surface (91) of the mounting substrate (9) being reduced.

According to an eleventh aspect, in the high frequency module (100*k*; 100*m*) according to the tenth aspect, the acoustic wave filter (1) is a transmission filter (112A) that is provided on a signal path (T1) for a transmission signal. The high frequency element (2) is a reception filter (122A) that is provided on a signal path (R1) for a reception signal.

According to this aspect, the influence on the acoustic wave filter (1) in printing on the shield layer (6) can be reduced while the area of the first main surface (91) of the mounting substrate (9) being reduced.

According to a twelfth aspect, the high frequency module (100*j*) according to any one of the first to eleventh aspects further includes a second element (2). The second element (2) is mounted on the first main surface (91) of the mounting substrate (9). A main surface (801) of the acoustic wave filter (1) that is near the mounting substrate (9) is farther away from the mounting substrate (9) than a main surface (801) of the second element (2) that is near the mounting substrate (9) is.

According to this aspect, the influence on the acoustic wave filter (1) in printing on the shield layer (6) can be reduced.

According to a thirteenth aspect, the high frequency module (100*p*) according to any one of the first to twelfth aspects further includes an electronic component (2) and a second protection member (4B). The electronic component (2) is mounted on the first main surface (91) of the mounting substrate (9). The second protection member (4B) is different from a first protection member (4A) as the protection member. The second protection member (4B) is disposed between the electronic component (2) and the shield layer (6) in a thickness direction (D1) of the mounting substrate (9).

According to this aspect, the influence on the acoustic wave filter (1) and the electronic component (2) in printing on the shield layer (6) can be reduced.

According to a fourteenth aspect, in the high frequency module (100*p*) according to the thirteenth aspect, the first protection member (4A) and the second protection member (4B) are made of the same materials.

According to this aspect, grinding can be performed in such a manner that the first protection member (4A) and the second protection member (4B) have the same height.

According to a fifteenth aspect, in the high frequency module (100*p*) according to the fourteenth aspect, the electronic component (2) is a second acoustic wave filter (2) that is different from a first acoustic wave filter (1) as the acoustic wave filter (1). A substrate (10A) of the first acoustic wave filter (1) and a substrate (10B) of the second acoustic wave filter (2) are made of different materials.

According to this aspect, even in the case where the substrate (10A) of the first acoustic wave filter (1) and the substrate (10B) of the second acoustic wave filter (2) are made of different materials, grinding can be performed in such a manner that the first protection member (4A) and the second protection member (4B) have the same height.

According to a sixteenth aspect, in the high frequency module (100*t*) according to any one of the thirteenth to fifteenth aspects, the acoustic wave filter (1) is a transmission filter (112C) that configures a duplexer (132A). The electronic component (2) is a reception filter (122C) that configures the duplexer (132A).

According to this aspect, the influence on the transmission filter (112C) and the reception filter (122C) in printing on the shield layer (6) can be reduced.

According to a seventeenth aspect, the high frequency module (100*q*; 100*r*; 100*s*; 100*t*) according to any one of the first to sixteenth aspects further includes a circuit element (3). The circuit element (3) is mounted on the second main surface (92) of the mounting substrate (9).

According to this aspect, the size reduction when viewed from the thickness direction (D1) of the mounting substrate (9) can be achieved.

According to an eighteenth aspect, in the high frequency module (100*q*; 100*r*; 100*s*) according to the seventeenth aspect, a main surface (802) of the circuit element (3) that is far from the mounting substrate (9) is exposed.

According to this aspect, an increase of the temperature of the circuit element (3) can be reduced.

According to a nineteenth aspect, the high frequency module (100*r*) according to the seventeenth or eighteenth aspect further includes an inner-layer inductor (94). The inner-layer inductor (94) is provided inside the mounting substrate (9). The inner-layer inductor (94) is connected to the circuit element (3). The acoustic wave filter (1), the circuit element (3), and the inner-layer inductor (94) overlap with one another when viewed in plan from a thickness direction (D1) of the mounting substrate (9).

With this arrangement, the parasitic capacitance generated between the inner-layer inductor (94) and the ground layer can be reduced. As a result, the power loss can be reduced.

According to a twentieth aspect, a communication apparatus (300; 300t) includes the high frequency module (100; 100a to 100u) according to any one of the first to nineteenth aspects and a signal processing circuit (301). The signal processing circuit (301) is connected to the high frequency module (100; 100a to 100u).

According to this aspect, printing on the module surface (shield layer 6) can be performed easily.

100, 100a, 100b, 100c, 100d, 100e, 100f, 100g, 100h, 100i, 100j, 100k, 100m, 100n, 100p, 100q, 100r, 100s, 100t, 100u high frequency module
1 first electronic component (acoustic wave filter, first acoustic wave filter)
10 first substrate (supporting substrate)
11 first main surface
12 second main surface
13 outer peripheral surface
14 first circuit unit
15 IDT electrode
16 first pad electrode
17 first spacer layer
18 first cover member
19 first terminal
193 low acoustic velocity film
194 piezoelectric layer
195 insulating layer
2 second electronic component (electronic component, second acoustic wave filter)
3 third electronic component
4 protection member
4A first protection member (protection member)
4B second protection member
41 first main surface
42 second main surface
43 outer peripheral surface
5 resin layer
51 main surface
53 outer peripheral surface
6 shield layer
61 first contact part
62 second contact part
600 identification mark
601 first part
602 second part
603 third part
7 resin layer
71 main surface
8 electronic component
801 first main surface
802 second main surface
803 outer peripheral surface
9 mounting substrate
91 first main surface
92 second main surface
93 outer peripheral surface
94 inner-layer inductor
80 external connection terminal
81 antenna terminal
82 signal input terminal
83 signal output terminal
85 ground terminal
20 adhesion layer
101 first bump
104 first switch
140 common terminal
141, 142 selection terminal
105 second switch
150 common terminal
151, 152 selection terminal
106 third switch
160 common terminal
161, 162 selection terminal
111 power amplifier
112A, 112B, 112C, 112D transmission filter
113 output matching circuit
115 controller
121 low noise amplifier
122A, 122B, 122C, 122D reception filter
123 input matching circuit
132A, 132B duplexer
171 first filter chip
173 first package substrate
1730 first supporting body
1731 first main surface
1732 second main surface
1733 electrode
1734 external connection electrode
1735 through electrode
174 bump
175 first sealing resin unit
180 first BAW resonator
181 first electrode
182 piezoelectric film
183 second electrode
184 cavity
185 electrical insulating film
201 first bump
202 second bump
300, 300t communication apparatus
301 signal processing circuit
302 RF signal processing circuit
303 baseband signal processing circuit
310 antenna
A1 acoustic reflector layer
A11 low acoustic impedance layer
A12 high acoustic impedance layer
D1 thickness direction
S1 first space
SP1 first space

The invention claimed is:
1. A high frequency module comprising:
a mounting substrate having a first main surface and a second main surface facing each other;
an acoustic wave filter mounted on the first main surface of the mounting substrate;
a protection member disposed on a main surface of the acoustic wave filter being farther from the mounting substrate;
a resin layer disposed on the first main surface of the mounting substrate and covering an outer peripheral surface of the acoustic wave filter and an outer peripheral surface of the protection member; and
a shield layer covering the resin layer and the protection member,
wherein the protection member is in contact with both the acoustic wave filter and the shield layer, wherein the acoustic wave filter comprises:
a piezoelectric substrate having a piezoelectric layer,
an IDT electrode disposed on the piezoelectric layer, and
a high acoustic velocity member disposed opposite to the IDT electrode with the piezoelectric layer interposed therebetween, an acoustic velocity of a bulk wave propagating in the high acoustic velocity member being higher than an acoustic velocity of an acoustic wave propagating in the piezoelectric layer, and
wherein a main surface of the piezoelectric substrate farther from the mounting substrate is in contact with the protection member,
wherein the high acoustic velocity member comprises a supporting substrate being a silicon substrate, and
wherein a main surface of the supporting substrate being farther from the mounting substrate is in contact with the protection member.

2. A high frequency module comprising:
a mounting substrate having a first main surface and a second main surface facing each other;
an acoustic wave filter mounted on the first main surface of the mounting substrate;
a protection member disposed on a main surface of the acoustic wave filter being farther from the mounting substrate;
a resin layer disposed on the first main surface of the mounting substrate and covering an outer peripheral surface of the acoustic wave filter and an outer peripheral surface of the protection member; and
a shield layer covering the resin layer and the protection member,
wherein the protection member is in contact with both the acoustic wave filter and the shield layer,
wherein the acoustic wave filter includes a supporting substrate that is a silicon substrate, and
wherein a main surface of the supporting substrate being farther from the mounting substrate is in contact with the protection member.

3. The high frequency module according to claim 1, further comprising an adhesion layer bonding the protection member to the acoustic wave filter.

4. The high frequency module according to claim 1, wherein a main surface of the protection member being farther from the mounting substrate protrudes toward the shield layer relative to a main surface of the resin layer being farther from the mounting substrate.

5. The high frequency module according to claim 1, wherein the shield layer includes
a first contact part being in contact with a main surface of the protection member being farther from the mounting substrate, and
a second contact part being in contact with an outer peripheral surface of the protection member along a thickness direction of the mounting substrate.

6. The high frequency module according to claim 1, wherein materials of the protection member include copper.

7. The high frequency module according to claim 1, wherein the protection member is an insulating material.

8. The high frequency module according to claim 1, wherein the acoustic wave filter is a transmission filter provided on a signal path for a transmission signal.

9. The high frequency module according to claim 1, further comprising a high frequency element mounted on the first main surface of the mounting substrate,
wherein the acoustic wave filter is mounted on a main surface of the high frequency element being farther from the mounting substrate.

10. The high frequency module according to claim 9,
wherein the acoustic wave filter is a transmission filter provided on a signal path for a transmission signal, and
wherein the high frequency element is a reception filter provided on a signal path for a reception signal.

11. The high frequency module according to claim 1, further comprising a second element mounted on the first main surface of the mounting substrate,
wherein the main surface of the acoustic wave filter being nearer to the mounting substrate is farther away from the mounting substrate than a main surface of the second element being nearer to the mounting substrate is.

12. The high frequency module according to claim 1, further comprising:
an electronic component mounted on the first main surface of the mounting substrate; and
a second protection member being different from a first protection member as the protection member and disposed between the electronic component and the shield layer in a thickness direction of the mounting substrate.

13. The high frequency module according to claim 12, wherein the first protection member and the second protection member are made of same materials.

14. The high frequency module according to claim 13,
wherein the electronic component is a second acoustic wave filter being different from a first acoustic wave filter as the acoustic wave filter, and
wherein a substrate of the first acoustic wave filter and a substrate of the second acoustic wave filter are made of different materials.

15. The high frequency module according to claim 12,
wherein the acoustic wave filter is a transmission filter configuring a duplexer, and
wherein the electronic component is a reception filter configuring the duplexer.

16. The high frequency module according to claim 1, further comprising a circuit element mounted on the second main surface of the mounting substrate.

17. The high frequency module according to claim 16, wherein a main surface of the circuit element being farther from the mounting substrate is exposed.

18. The high frequency module according to claim 16, further comprising an inner-layer inductor provided inside the mounting substrate,
wherein the inner-layer inductor is connected to the circuit element, and
wherein the acoustic wave filter, the circuit element, and the inner-layer inductor overlap with one another when viewed in plan from a thickness direction of the mounting substrate.

19. A communication apparatus comprising:
the high frequency module according to claim 1; and
a signal processing circuit connected to the high frequency module.

* * * * *